United States Patent
Fujimoto et al.

[11] Patent Number: 6,154,105
[45] Date of Patent: Nov. 28, 2000

[54] SURFACE ACOUSTIC WAVE DEVICE WITH SPECIFIC ELECTRODE MATERIALS AND QUARTZ SUBSTRATE EULER ANGLES

[75] Inventors: Koji Fujimoto, Otsu; Michio Kadota, Kyoto; Toshimaro Yoneda; Takeshi Nakao, both of Nagaokakyo, all of Japan

[73] Assignee: Murata Manufacturing Co., Ltd., Japan

[21] Appl. No.: 09/249,036

[22] Filed: Feb. 12, 1999

[30] Foreign Application Priority Data

Feb. 16, 1998 [JP] Japan .................................. 10-033121
Jan. 11, 1999 [JP] Japan .................................. 11-004197

[51] Int. Cl.[7] .................................................. H03H 9/64
[52] U.S. Cl. ..................... 333/194; 333/195; 310/313 A; 310/361; 310/363
[58] Field of Search ..................................... 333/193–196; 310/313 R, 313 A, 313 B, 313 C, 313 D, 360, 361, 363

[56] References Cited

U.S. PATENT DOCUMENTS

| | | | |
|---|---|---|---|
| 5,392,013 | 2/1995 | Yamamoto et al. | 333/195 |
| 5,729,186 | 3/1998 | Seki et al. | 310/313 B X |
| 5,831,493 | 11/1998 | Ushiroku | 310/313 D X |
| 5,847,486 | 12/1998 | Kadota et al. | 310/313 R |
| 5,850,167 | 12/1998 | Abe | 310/313 B X |
| 5,953,433 | 9/1999 | Fujimoto et al. | 381/337 |

FOREIGN PATENT DOCUMENTS

| | | |
|---|---|---|
| 0 860 943 A2 | 8/1998 | European Pat. Off. . |
| 61-45892 | 10/1986 | Japan . |
| 10-224172 | 8/1998 | Japan . |
| 2 288 503 | 10/1995 | United Kingdom . |
| 97/25776 | 7/1997 | WIPO . |

*Primary Examiner*—Robert Pascal
*Assistant Examiner*—Barbara Summons
*Attorney, Agent, or Firm*—Keating & Bennett, LLP

[57] ABSTRACT

A surface acoustic wave device includes a quartz substrate having an angle θ of Euler angles (0, θ, 90°) that satisfies $122° \leq \theta \leq 131°$. An interdigital transducer made of an electrode material including at least one of Ta and W is disposed on the quartz substrate.

20 Claims, 14 Drawing Sheets

SURFACE ACOUSTIC WAVE DEVICE WITH SPECIFIC ELECTRODE MATERIALS AND QUARTZ SUBSTRATE EULER ANGLES

BACKGROUND OF THE INVENTION

1. Field of the Invention

The present invention relates to a surface acoustic wave device containing a quartz substrate and, more particularly, to a surface acoustic wave device which has excellent, stable resonant characteristics achieved by a unique combination of the quartz substrate and electrodes.

2. Description of the Related Art

A surface acoustic wave device containing a quartz substrate serving as a piezoelectric substrate is disclosed in Japanese Examined Patent Publication No. 61-45892.

In the above-mentioned prior art surface acoustic wave device, an interdigital transducer for transmission and reception of signals includes gold electrodes which are disposed on a quartz substrate. The quartz substrate is a quartz rotation Y plate. It is described that the frequency-temperature characteristics of the device are improved by setting X defined by the formula: $X=\{a/(a+b)\}(h_0/\lambda)$, where $h_0$ is the electrode film thickness of the interdigital transducer (hereinafter, referred to as IDT), a is the electrode finger width, b is the electrode finger gap, and $\lambda$ is the wavelength of a surface acoustic wave to be excited, and a cut direction $\theta$, so as to satisfy the formula:

$$\theta=(-18707.5X^2+21.429X+129.5).$$

However, in the above-described surface acoustic wave device, Au is used as a material for forming electrodes which defines the transducer IDT. This causes the cost of the device to significantly increase and also makes the process of forming the device extremely difficult.

SUMMARY OF THE INVENTION

To overcome the problems described above, preferred embodiments of the present invention provide a surface acoustic wave device which is inexpensive, has an electrode structure that is easily formed, and has excellent, stable resonant characteristics.

According to one preferred embodiment of the present invention, a surface acoustic wave device includes a quartz substrate having an angle $\theta$ of Euler angles (0, $\theta$, 90°) which satisfies $122° \leq \theta \leq 131°$, and an interdigital transducer made of an electrode material containing one of Ta and W and disposed on the quartz substrate.

According to this unique structure, the surface acoustic wave device achieves excellent frequency temperature characteristics and resonant characteristics. In addition, Ta and W are inexpensive, as compared with gold electrodes, so that the cost of the surface acoustic wave device is significantly reduced. Moreover, as compared with Au, either Ta and W is easily processed. Thus, the surface acoustic wave device according to preferred embodiments of the present invention has excellent resonant characteristics and is constructed so as to be formed with high stability and with high precision.

The angle $\theta$ of the Euler angles (0, $\theta$, 90°) is preferably between about 125° and about 128° so that the surface acoustic wave device has even more excellent resonant characteristics.

The interdigital transducer may have an electrode finger cross width (aperture) of up to about 40 $\lambda$ where $\lambda$ represents the wavelength of a surface acoustic wave to be excited. In this case, an unnecessary spurious response caused in the lateral mode in the band is effectively inhibited, thereby obtaining excellent resonant characteristics.

The angle $\theta$ of the Euler angles preferably satisfies the following formula (1) in the case where the IDT is made of Ta, and the formula (2) in the case where the IDT is made of W, respectively:

$\theta=125.44+108.27 \times d \times h/\lambda \pm 1.2$                formula (1)

$\theta=125.70+49.87 \times d \times h/\lambda \pm 1.2$                formula (2)

In this case, the frequency varying ratio can have a value of up to about 200 ppm in a temperature range from about −20° C. to about 80° C.

The surface acoustic wave resonator may include reflectors arranged on the opposite sides of the transducer IDT in the surface acoustic wave propagation direction. Further, the number $N_{IDT}$ of the electrode finger pairs of the interdigital transducer and the number $N_{REF}$ of electrode fingers of the reflector may be adjusted as desired.

The surface acoustic wave resonator according to preferred embodiments of the present invention can be successfully and easily incorporated in a surface acoustic wave filter or a longitudinally coupled device.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

A surface acoustic wave device according to preferred embodiments of the present invention will be now described by way of non-restrictive structure examples, with reference to the drawings.

Figure 1:
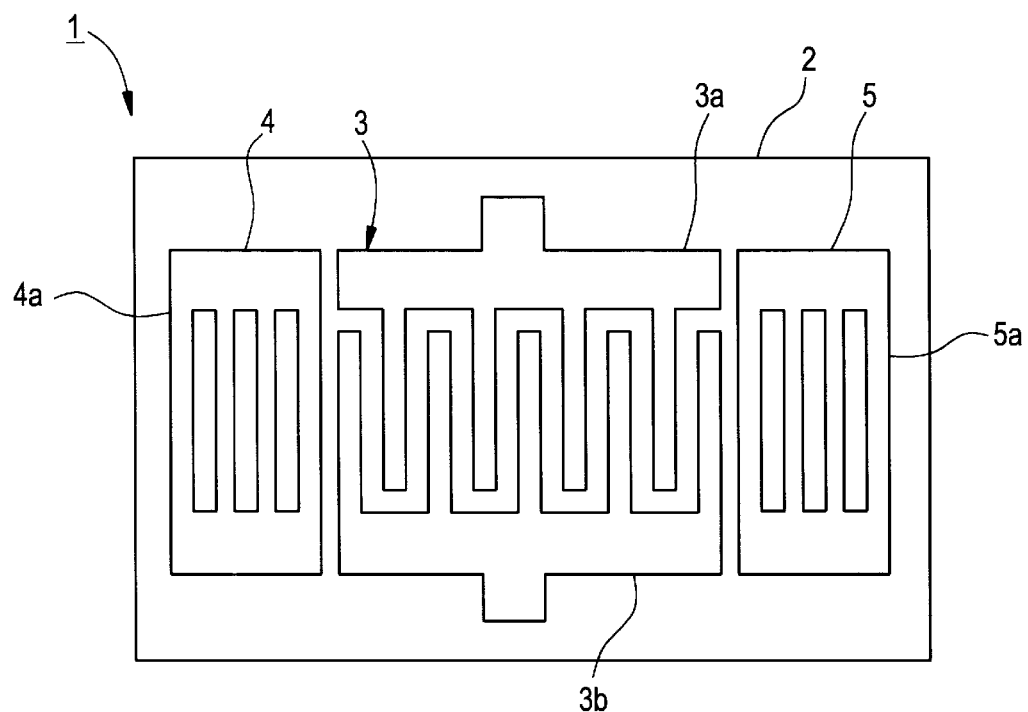
FIG. 1 is an explanatory plan view of a surface acoustic wave device according to a preferred embodiment of the present invention.

FIG. 1 is a plan view illustrating a surface acoustic wave resonator according to a first preferred embodiment of the present invention.

A surface acoustic wave resonator 1 includes a quartz substrate 2. In the quartz substrate 2, the angle θ of Euler angles (0, θ, 90°) preferably satisfies the formula:

$$122°≤θ≤131°.$$

An IDT 3 is provided on the quartz substrate 2. The IDT 3 includes a pair of interdigital electrodes 3a and 3b. The electrode fingers of the interdigital electrodes 3a and 3b are inserted into the spaces between them.

Grating type reflectors 4,5 having plural electrode fingers short-circuited at the opposite ends thereof, respectively, are arranged on the opposite sides of the IDT 3 along the surface acoustic wave propagation direction.

It is preferable that the IDT 3 and the reflectors 4,5 are formed with tungsten (W). The IDT 3 and the reflectors 4, 5 are preferably formed on the quartz substrate 2 by a thin film forming method such as vapor depositing, CVD, plating, sputtering tungsten, and or other suitable method.

In the surface acoustic wave resonator 1 of this preferred embodiment of the present invention, the angle θ of Euler angles (0, θ, 90°) is preferably in a range of about 122° to about 131°. Accordingly, by utilizing an SH type surface acoustic wave, the bandwidth can be greatly increased. Thus, the allowance and tolerance for variations in the center frequency, caused by changes in temperature, can be greatly improved. This will be described below.

A conventional ST cut X propagation quartz substrate used in many devices has good frequency-temperature characteristics. As a result, the electromechanical coefficient $K^2$ for a Raleigh wave is 0.14%. On the other hand, in the case of excitation of a Love wave or a pseudo Love wave by means of the quartz substrate having the particular Euler angles used in this example, the electromechanical coefficient $K^2$ is 0.64%.

In general, the bandwidth of a surface acoustic wave device is proportional to its electromechanical coefficient $K^2$. Accordingly, assuming that the center frequency $f_0$ available in a conventional surface acoustic wave device using a Raleigh wave is $f_0$=200 MHz and the bandwidth is 50 KHz, the bandwidth available in the surface acoustic wave resonator 1 is 230 KHz, because the electromechanical coefficient $K^2$ for the surface acoustic wave resonator 1 of this preferred embodiment is about 4.6 times that of the above-described ST cut X propagation quartz substrate of the surface acoustic wave device using a Raleigh wave.

The difference between the above-mentioned bandwidths, namely, 230−50=180 KHz provides allowance or tolerance for variations in the center frequency. More particularly, with respect to the shift of the frequency caused by changes in temperature, a filter containing the surface acoustic wave resonator 1 constructed according to this preferred embodiment provides an allowance of ±90 KHz. The allowance at $f_0$=200 MHz is converted to that on a unit frequency basis to provide 180 KHA/200 MHz=900 ppm. That is, the allowance is −450 ppm on the low frequency side of the pass band and is +450 ppm on the high frequency side of the pass band. The varying-ratio of the frequency per 1° C., required for the surface acoustic wave device containing a ST cut X propagation quartz substrate and using a Raleigh wave, is ±1 ppm/° C. or lower. A filter including the surface acoustic wave resonator 1 of this preferred embodiment has an allowance for variations in the center frequency caused by changes in temperature of about 900 ppm as described above. In the case of the practical use temperature range (−10° C. to 50° C.), the allowance is increased by 900 ppm/60° C.=15 ppm/° C. As described below, for the surface acoustic wave device of various preferred embodiments of the present invention, an optimum cut angle at which the frequency-varying ratio for the change of temperature from about −20° C. to about 80° C., namely, for the temperature change of about 100° C., is up to about 100 ppm, that is, the ratio per 1° C. up to 1 ppm/° C., is θ=about 125° to about 128° where θ is the following one of the Euler angles (0, θ, 90°).

Figure 2:
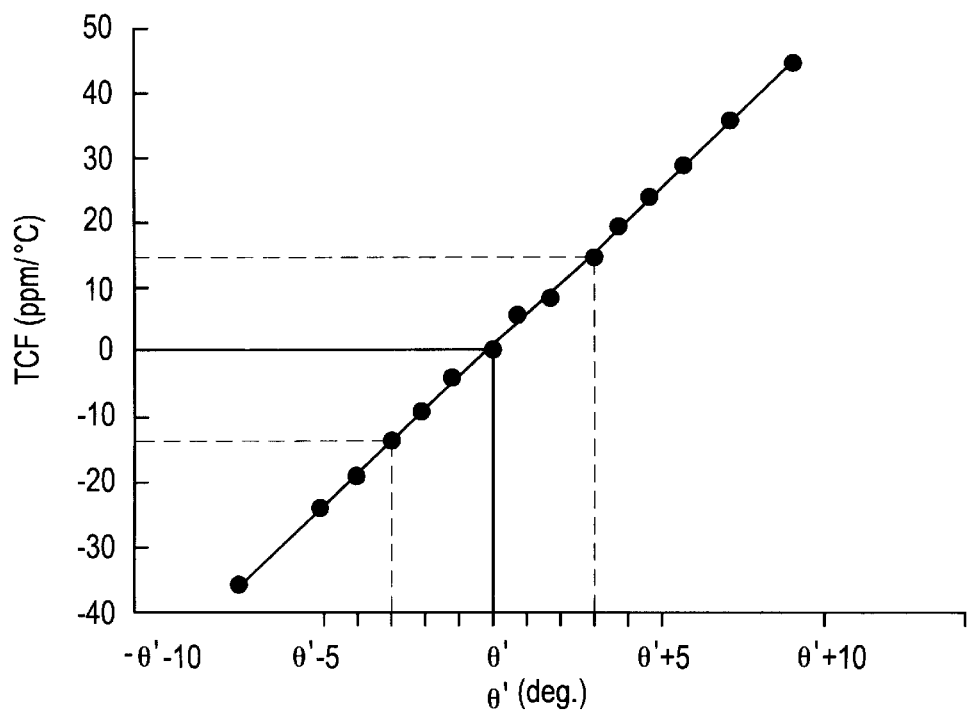
FIG. 2 is a graph illustrating a relationship between the change of the angle $\theta$ of Euler angles (0, $\theta$, 90°) and the frequency temperature coefficient TCF when the angle $\theta'$ is in the range of about 125° to about 128°.

The temperature characteristics of the surface acoustic wave resonator were measured by varying θ', taken as a standard angle, which is within the above range, in such a manner to be increased or decreased with respect to the standard angle. The results are shown in FIG. 2. In the case of θ'=125° and θ'=128°, a similar tendency is exhibited. Thus, it is expected that the same results will be achieved when θ' is any angle that it is in the range of about 125° to about 128°. As seen in FIG. 2, the frequency temperature coefficients are 15 ppm/° C. at θ'+3° and −15 ppm/° C. at θ'−3°. This indicates that the temperature characteristics required on an ordinary level can be realized at approximately 122°≦θ≦131°.

Accordingly, in the approximate range of θ=122° to 131°, the allowance for variations in the center frequency caused by changes in temperature is greatly improved. Thus, the surface acoustic wave resonator and a device such as a filter containing the resonator having excellent frequency temperature characteristics are achieved. In addition, as clearly understood in FIG. 2, even more excellent frequency temperature characteristics are achieved in the approximate range of θ=125° to 128°.

With respect to the cut angle of the quartz substrate, the production error is about ±0.3°. Accordingly, a predetermined cut angle can be substantially realized. On the other hand, for the surface acoustic wave propagation direction, the production error is about ±2°, depending on exposure techniques. Accordingly, it is possible that if the desired cut angle is about 90°, the surface acoustic wave resonator actually produced will have a cut angle in the range of about 88° to about 92°. However, the production error with respect to the propagation direction does not exert a great influence over the characteristics. Accordingly, it should be noted that even if the propagation direction is shifted by about ±2°, the advantages of preferred embodiments of the present invention can still be obtained.

Figure 3:
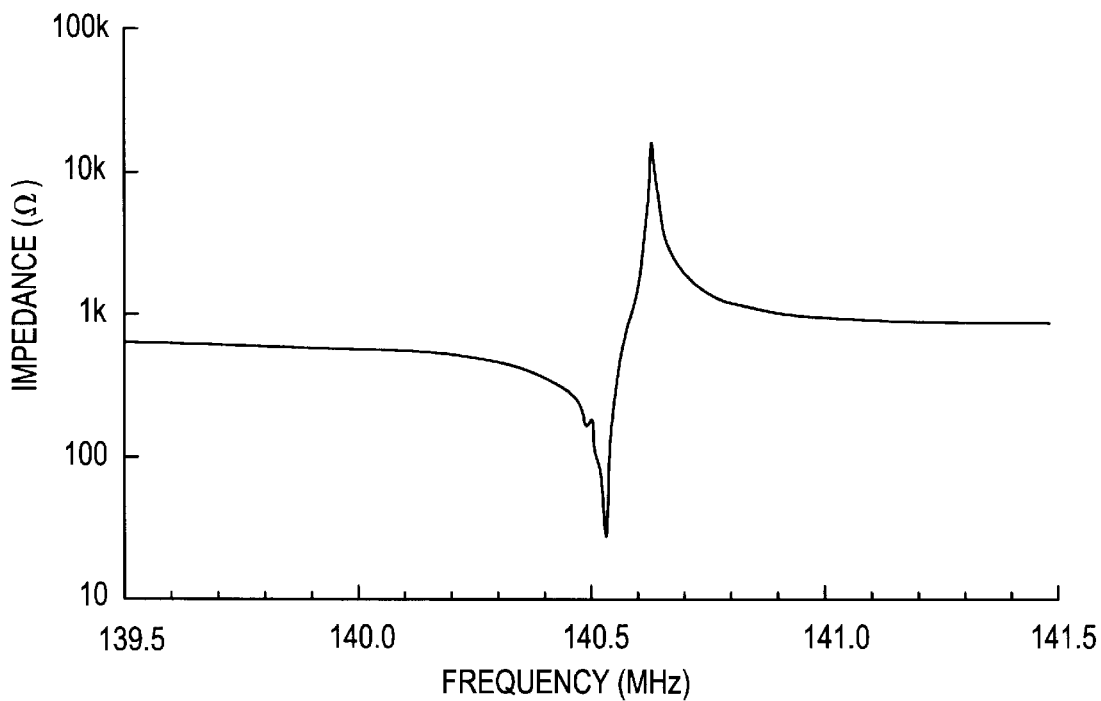
FIG. 3 is a graph showing the resonant characteristics of the surface acoustic wave device of the preferred embodiment of the present invention shown in FIG. 1.

Hereinafter, the resonant characteristics of the surface acoustic wave resonator having the angle θ of Euler angles (0, θ, 90°) in the range of about 125° to about 128°, as a preferable example of preferred embodiments of the present surface acoustic wave resonator, will be described. FIG. 3 shows the impedance-frequency characteristics of the surface acoustic wave resonator 1 containing the quartz substrate having the above-described Euler angles. As seen in FIG. 3, although IDT 3 and the reflectors 4, 5 are made of tungsten as an electrode material, excellent resonant characteristics are still achieved. Thus, the surface acoustic wave resonator 1 having excellent resonant characteristics can be inexpensively provided. The IDT 3 and the reflectors 4, 5, as compared with the case using gold electrodes, have a high bonding strength for the quartz substrate. Accordingly, the formation process of IDT 3 and the reflectors 4, 5 is performed easily, and the IDT 3 and the reflectors 4, 5 are able to be formed extremely accurately.

The characteristics illustrated in FIG. 3 are achieved when the size of the quartz substrate is approximately 1.5 mm×1.8 mm×0.4 mm, the angle θ is about 126°, the number of electrode finger pairs of IDT 3 is 25, and the respective numbers of the electrode fingers 4a, 5a of the reflectors 4, 5 are 10. H/λ and d are set to be 0.015 and 0.6, respectively. It has been confirmed that the same characteristics are obtained by setting H/λ at a value of from 0.010 to 0.025 and d at a value of from 0.4 to 0.8.

Figure 4:
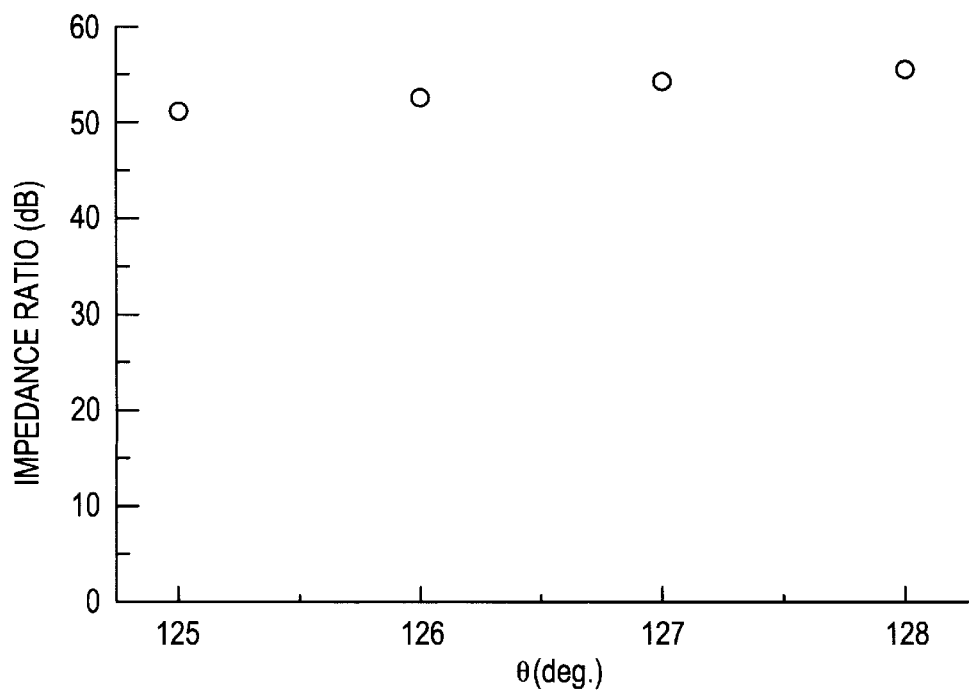
FIG. 4 is a graph showing changes in impedance ratio when $\theta$ is varied.

The inventors of the present invention have discovered and confirmed through forming actual devices that excellent resonant characteristics are achieved by using a quartz substrate having Euler angles (0, θ, 90°) with θ=126° and forming IDT3 and reflectors 4, 5 with tungsten. Further, by varying the angle θ, an analysis was done to confirm the range of cut angles at which such excellent resonant characteristics as shown in FIG. 3 are achieved. More particularly, different surface acoustic wave resonators were prepared in a manner similar to that for the above-described surface acoustic wave resonator 1, except for the angle θ. The resulting characteristics were evaluated. The results are shown in FIG. 4. In FIG. 4, the angle θ is plotted as the abscissa and the impedance ratio as the ordinate.

As seen in FIG. 4, it has been determined that in the θ range of about 125° to about 128°, the surface acoustic wave resonators have excellent resonant characteristics as shown in FIG. 3.

Further, the inventors of the present invention, based on the above-described results, made an examination of different ways to obtain a surface acoustic wave resonator having less temperature-dependent changes of the resonant characteristics, that is, the excellent temperature characteristics. As a result, it was discovered that such a surface acoustic wave resonator can be obtained when the electrode material used to form the transducer IDT is Ta, and the angle θ satisfies the formula (1): $\theta = 125.44 + 108.27 \times d \times h/\lambda \pm 1.2$, where h and d represent the film thickness and the electrode finger metallization ratio of the transducer IDT, respectively. The metallization ratio d of the transducer IDT is a value defined by $d = d_1/(d_1 + d_2)$ where $d_1$ and $d_2$ represent the width of the respective electrode fingers of the transducer IDT and the width of the respective gaps between the electrode fingers, respectively.

Figure 5:
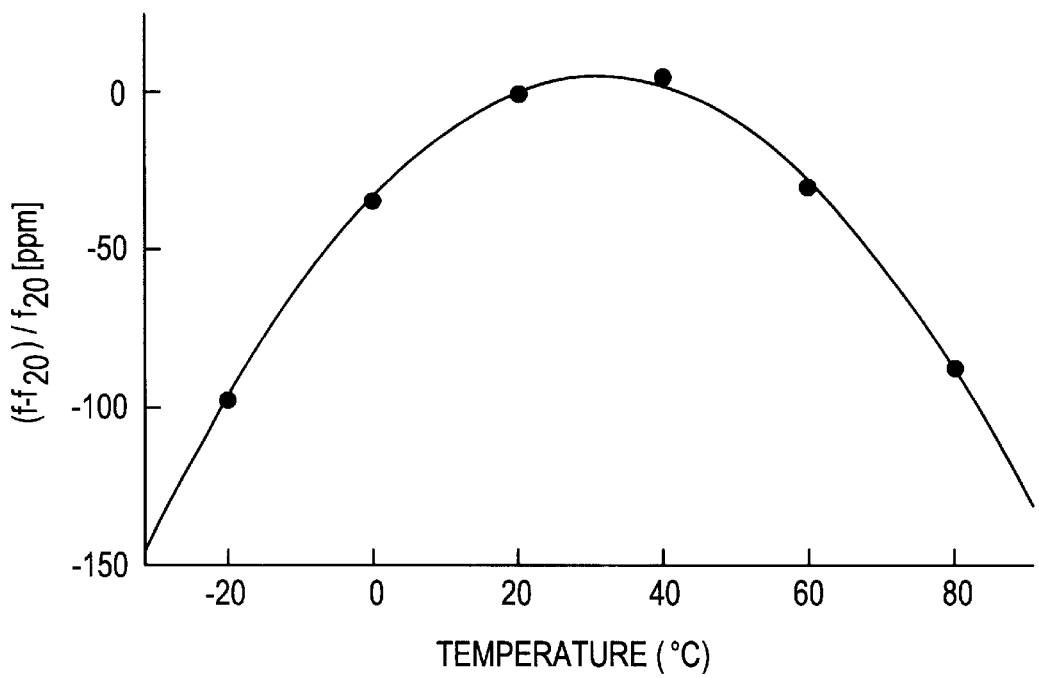
FIG. 5 is a graph showing the frequency temperature characteristics of the surface acoustic wave resonator of the preferred embodiment of the present invention when $d \times h/\lambda=0.02$ and $\theta=127°$.

FIG. 5 is a graph illustrating the frequency temperature characteristics of the surface acoustic wave resonator 1 which is obtained by forming an IDT of Ta on the quartz substrate with an angle θ=127°, namely, the Euler angles (0, 127°, 90°), in such a manner that the transducer IDT has an approximate thickness of h/λ=0.02, and the ratio d is equal to about 0.6. In FIG. 5, $(f - f_{20})/f_{20}$ (ppm) represents the frequency varying ratio of the resonant frequency f, as measured at the standard temperature of about 20° C. In FIG. 5, the temperature at the apex of the curve is about 34° C., and the frequency varying ratio of the resonant frequency in the range from about −20° C. to about 80° C. is approximately 99 ppm.

Figure 6:
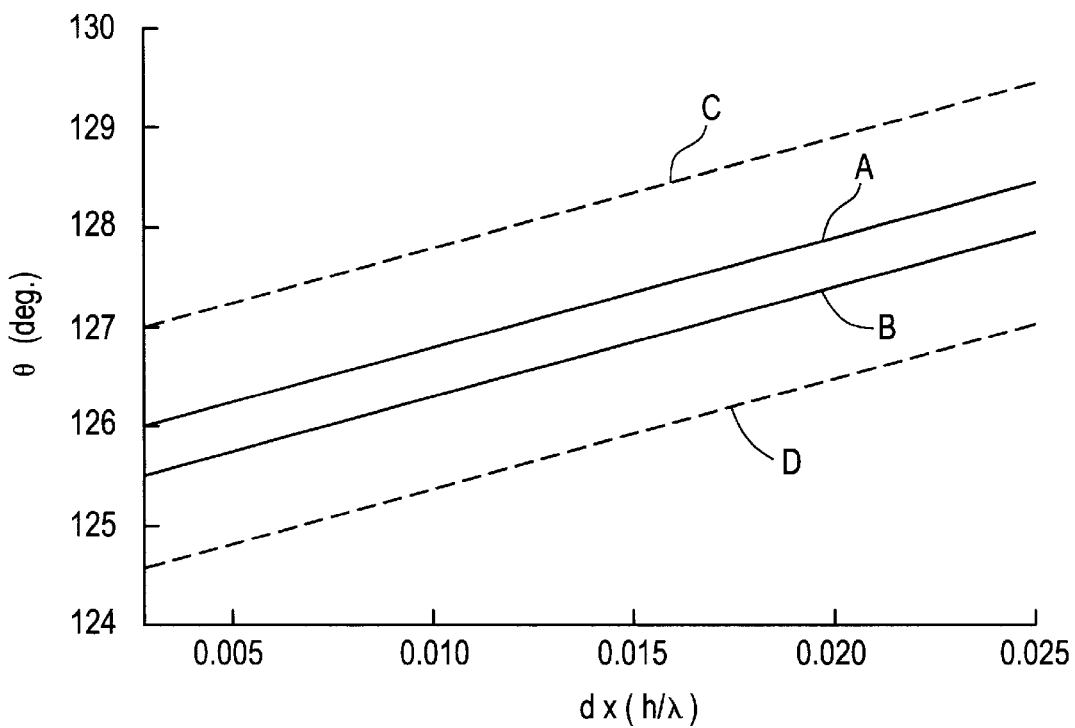
FIG. 6 is a graph showing the relationship between $d \times (h/\lambda)$ and $\theta$ of the surface acoustic wave resonator of a preferred embodiment of the present invention having an electrode material which is Ta.

FIG. 6 shows a relationship between $d \times (h/\lambda)$ and θ, obtained when the frequency varying ratio of the resonant frequency is constant in the temperature range from about −20° C. to about 80° C. In FIG. 6, solid lines A and B define the range where the frequency varying ratio of the resonant frequency is less than about 100 ppm. Broken lines C and D define the range where the frequency varying ratio of the resonant frequency is less than about 200 ppm.

That is, the range defined by the broken lines C and D including the error can be expressed by the formula (1). The range defined by the solid lines A and B including the error can be expressed by the following formula (3):

$$\theta=125.44+108.27\times d\times(h/\lambda)\pm0.3 \qquad \text{formula (3)}.$$

As seen in the above description, when Ta is used as the electrode material, the surface acoustic wave resonator which achieves excellent temperature characteristics can be provided by setting θ to satisfy the above-described range defined by the formula (1), more preferably, by the formula (3).

Moreover, the inventors of the present invention conducted an investigation to achieve the surface acoustic wave resonator having excellent temperature characteristics in the same way as described above, except that W was used as the electrode material instead of Ta. As a result, it was discovered that advantageous results described above can be achieved by setting θ to satisfy the range defined by the following formula (2):

$$\theta=125.70+49.87\times d\times h/\lambda\pm 1.2 \qquad \text{formula (2)}.$$

Figure 7:
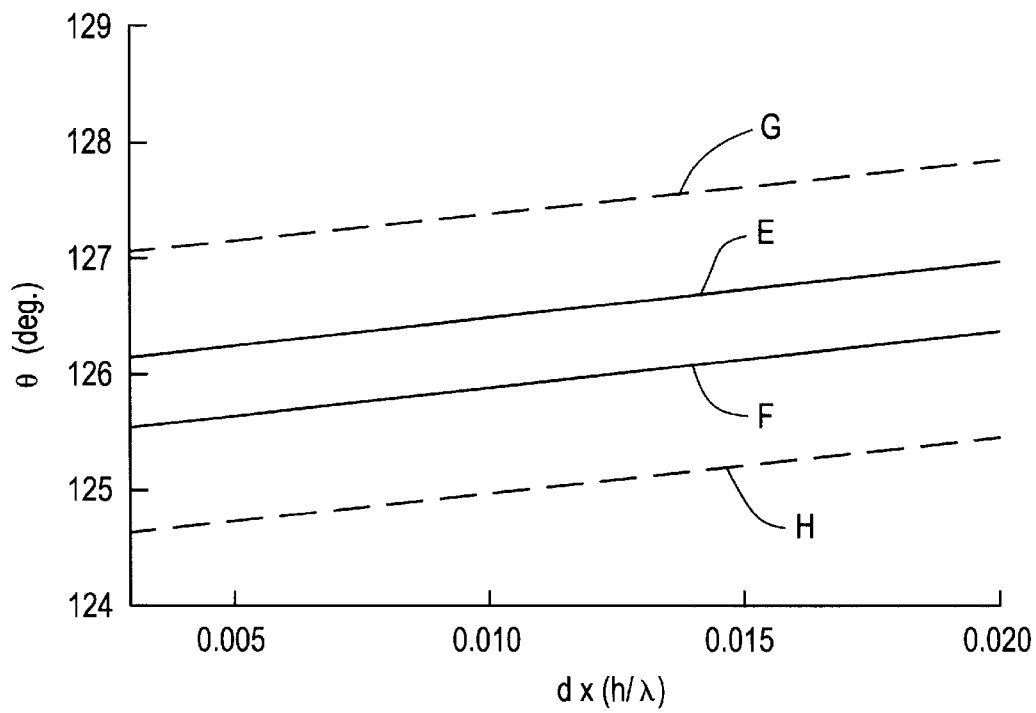
FIG. 7 is a graph showing the relation between $d \times (h/\lambda)$ and $\theta$ of the surface acoustic wave resonator of a preferred embodiment of the present invention having an electrode material which is W.

FIG. 7 is a graph corresponding to that of FIG. 6 except that W is used for the electrode material, which illustrates the relationship between d×(h/λ) and θ, obtained when the frequency varying ratio of the resonant frequency is constant in the temperature range from about −20° C. to about 80° C. In FIG. 7, solid lines E and F define the range where the frequency varying ratio of the resonant frequency has a value up to about 100 ppm. Broken lines G and H define the range where the frequency varying ratio of the resonant frequency has a value up to about 200 ppm.

The range defined by the broken lines G and H in FIG. 7 including the error can be expressed by the above formula (2).

Further, the range defined by the solid lines E and F in FIG. 7 including the error can be expressed by the following formula (4).

$$\theta=125.70+49.87\times d\times(h/\lambda)\pm0.3 \qquad \text{formula (4)}.$$

The surface acoustic wave resonator 1 having a varying ratio of the resonant frequency in the range from about −20° C. to about 80° C. of up to about 200 ppm, more preferably, up to about 100 ppm can be provided by setting the angle θ to be in the range satisfying the formula (2), more preferably, the formula (4).

In the above-described preferred embodiment, the IDT 3 and the reflectors 4,5 are formed with tungsten or tantalum. However, the IDT 3 only may be formed with tungsten or tantalum.

In addition, it is not necessary to form all of the IDT 3 with tantalum or tungsten. The IDT 3 may have the structure in which a thin film of another metallic material is laminated onto the W or Ta.

The inventors of the present invention discovered that, in the surface acoustic wave device having a transducer IDT made of an electrode material containing Ta or W and disposed on the quartz substrate having the particular Euler angles, a spurious response caused in the lateral mode is greatly inhibited by setting the cross width of the electrode fingers of the IDT to be about 40 λ or shorter.

Figure 8:
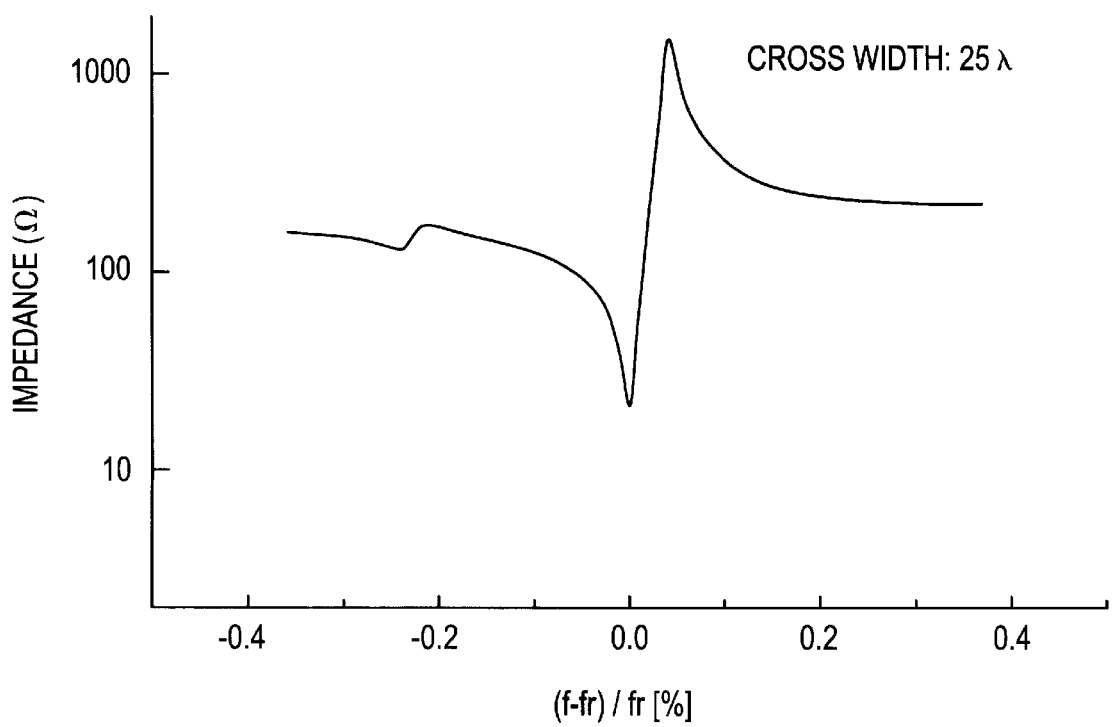
FIG. 8 is a graph showing the relationship between the frequency normalized by the resonant frequency and the impedance of the surface acoustic wave resonator of a preferred embodiment of the present invention having an electrode finger cross width (aperture) of the IDT of about 25 $\lambda$.
Figure 9:
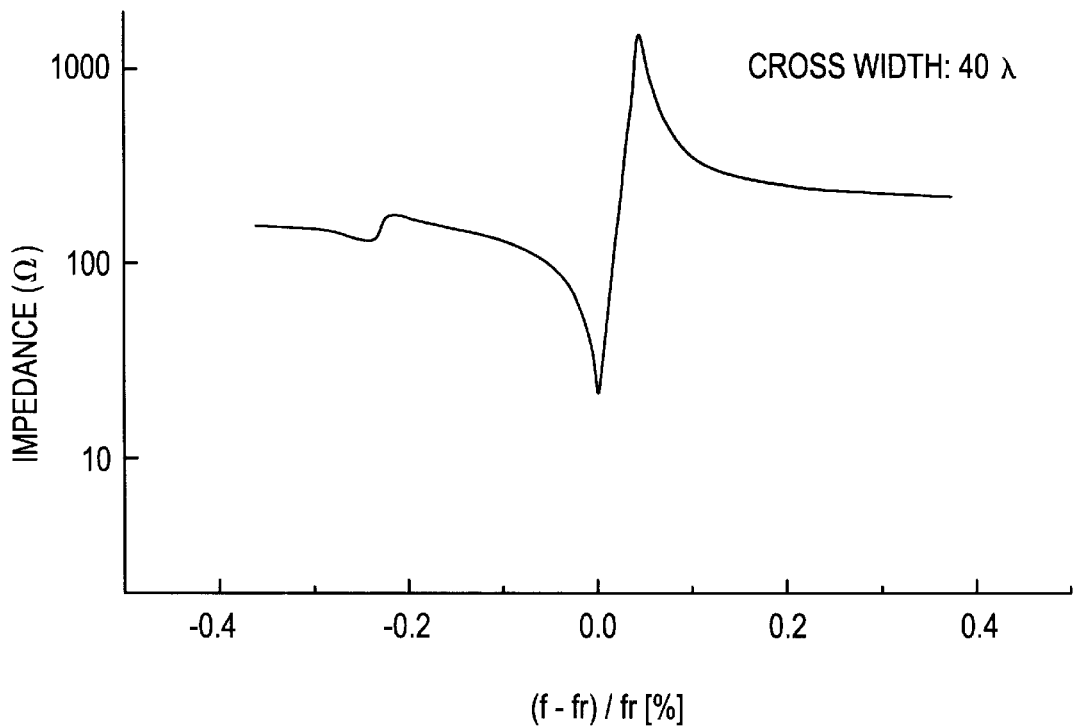
FIG. 9 is a graph showing the relationship between the frequency normalized by the resonant frequency and the impedance of the surface acoustic wave resonator of a preferred embodiment of the present invention having an electrode finger cross width of the IDT of about 40 λ.
Figure 10:
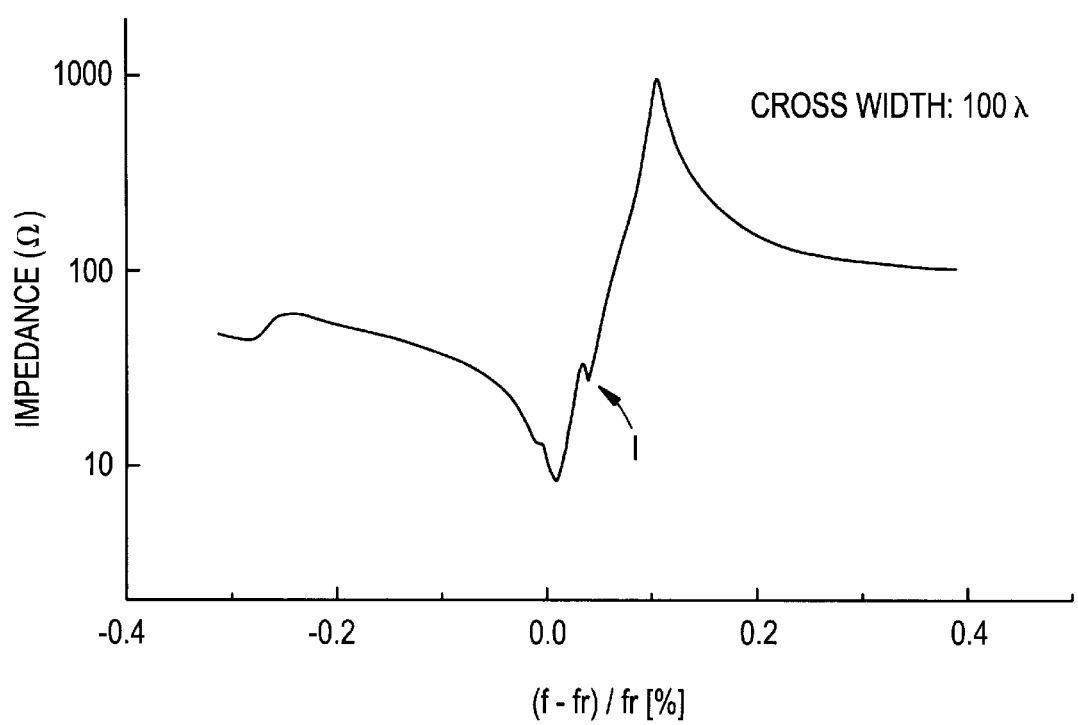
FIG. 10 is a graph showing the relationship between the frequency normalized by the resonant frequency and the impedance of the surface acoustic wave resonator of a preferred embodiment of the present invention having an electrode finger cross width of the IDT of about 100 λ.

More particularly, in one example of preferred embodiments of the present invention, a transducer IDT made of Ta was formed on the quartz substrate with the Euler angles (0, 127°, 90°) in such a manner to have approximate ratios h/λ=0.02 and d=0.6, and thereby, the surface acoustic wave device shown in FIG. 1 was constructed. Moreover, plural types of surface acoustic wave resonators 1 having the number $N_{IDT}$ of electrode pairs of IDTs of 50 and different electrode finger cross widths were produced. The impedance-frequency characteristics were measured. FIGS. 8 through 10 show the results. On the abscissas in FIGS. 8 through 10, the frequencies normalized by using the resonant frequency, expressed as (f−fr)/fr×100% where f and fr represent a frequency and a resonant frequency, respectively, are plotted. It has been confirmed that the same characteristics are obtained by setting H/λ at a value of from 0.010 to 0.027 and d at a value of from 0.4 to 0.8.

FIGS. 8, 9, and 10 show the results obtained at electrode finger cross widths of 25 λ, 40 λ, and 100 λ, respectively.

As seen in FIG. 10, in the case of the electrode finger cross width of 100 λ, a large spurious resonance is generated between the resonant point and the anti-resonant point, namely, in the lateral mode in the frequency band, as indicated by arrow I. On the other hand, for the characteristics illustrated in FIGS. 8 and 9, such a spurious response is not produced and does not appear between the resonant point and the anti-resonant point.

It is speculated that the above-described spurious response is generated because the vibration in a higher order mode occurs near the vibration in the basic mode.

Accordingly, as seen in FIG. 9, the spurious response caused by the higher mode vibration is greatly inhibited by setting the electrode finger cross width to be about 40 λ or shorter.

Accordingly, in the surface acoustic wave device of preferred embodiments of the present invention, a spurious response in the frequency band is effectively inhibited by setting the electrode finger cross width of the transducer IDT to about 40 λ or shorter. This provides excellent resonant characteristics.

As understood in the above formulae (1) and (2), the configuration for achieving excellent temperature characteristics by adjusting the angle θ and inhibiting the spurious response in the frequency band by setting the electrode finger cross width to be about 40 λ or shorter can be applied to the other surface acoustic wave devices such as a surface acoustic wave filter, not only to the above-described surface acoustic wave resonator 1. In this case, excellent effects are also achieved.

Figure 11:
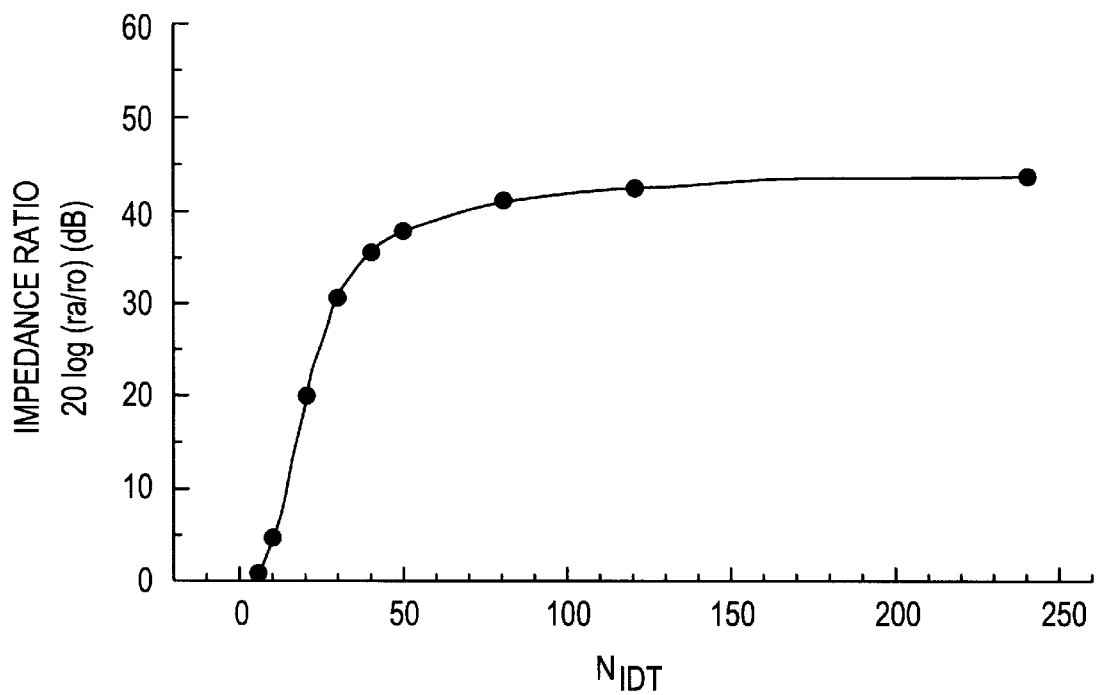
FIG. 11 is a graph showing the relationship between the number $N_{IDT}$ of electrode pairs of IDT and the impedance ratio of the surface acoustic wave resonator of a preferred embodiment of the present invention.

Moreover, the inventors of the present invention made an examination of how the characteristics of the surface acoustic wave resonator 1 having the reflectors arranged on the opposite sides of the transducer IDT, as shown in FIG. 1, are affected by the number $N_{IDT}$ of electrode finger pairs of IDT. For the purpose of excluding the effects of the reflectors 4, 5, the surface acoustic wave resonator was constructed by forming the transducer IDT of Ta on the quartz substrate with the Euler angles (0, 127°, 90°) in such a manner that the transducer IDT has approximate ratios of h/λ=0.02 and d=0.6 without the reflectors 4, 5 provided. The impedance ratio of the obtained plural types of the surface acoustic wave resonators was measured by varying the number $N_{IDT}$ of electrode fingers of IDT. The results are shown in FIG. 11. The impedance ratio is defined as a value calculated according to 20 log(ra/ro) where ro and ra represent the resonant resistance and the anti-resonant resistance, respectively.

As seen in FIG. 11, the impedance ratio is increased with the number $N_{IDT}$. When the $N_{IDT}$ exceeds 200, the impedance ratio becomes saturated.

Accordingly, by adjusting the number $N_{IDT}$ in the range that the number $N_{IDT}$ has a value up to 200, the surface acoustic wave device having an appropriate impedance ratio can be obtained.

Thus, the surface acoustic wave resonator having the transducer IDT made of Ta disposed on the quartz substrate with the above particular Euler angles in accordance with preferred embodiments of the present invention, the surface acoustic wave resonator having an appropriate impedance ratio can be easily provided by setting the pair number of IDTs to be 200 or smaller. Thus, desired excellent characteristics can be easily realized.

Similarly, the inventors of the present invention measured the bandwidth ratio (fa−fr)/fr and the resonant resistance ro of the surface acoustic wave resonator 1 at different numbers $N_{IDT}$. The results are shown in FIGS. 12 and 13, respectively.

Figure 12:
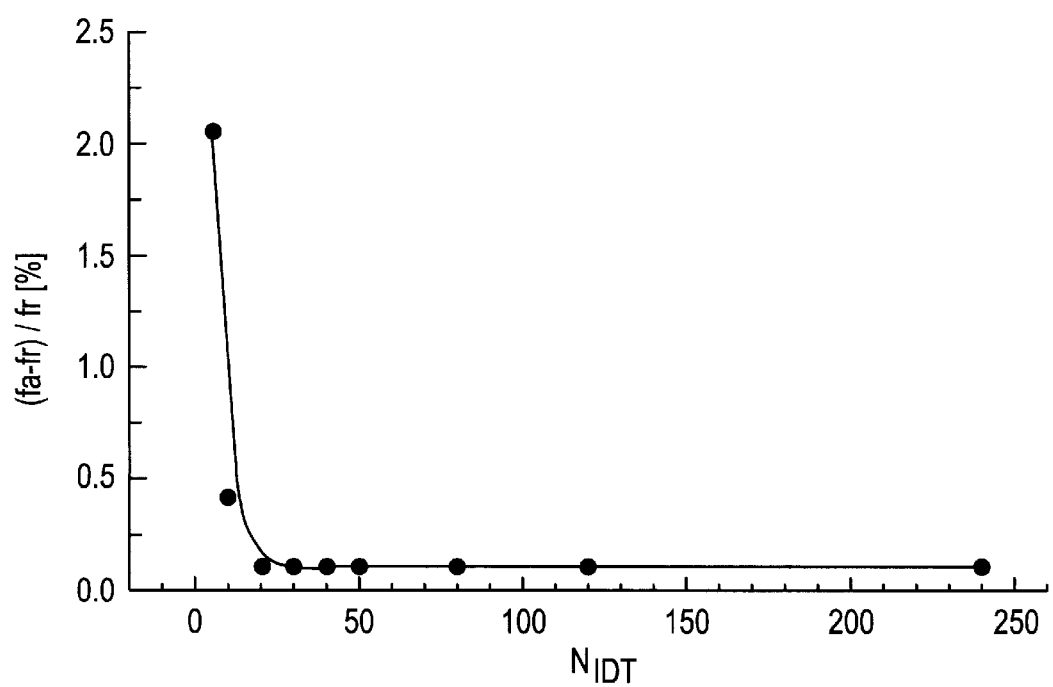
FIG. 12 is a graph showing the relationship between the number $N_{IDT}$ of electrode pairs of IDT and the bandwidth ratio of the surface acoustic wave resonator of a preferred embodiment of the present invention.

As seen in FIG. 12, the bandwidth ratio is reduced as the number $N_{IDT}$ increases. When the number $N_{IDT}$ exceeds 20, the bandwidth ratio becomes substantially constant. Accordingly, when the number $N_{IDT}$ is set to have a value up to 20, the band width ratio can be easily controlled by adjusting the number $N_{IDT}$.

Figure 13:
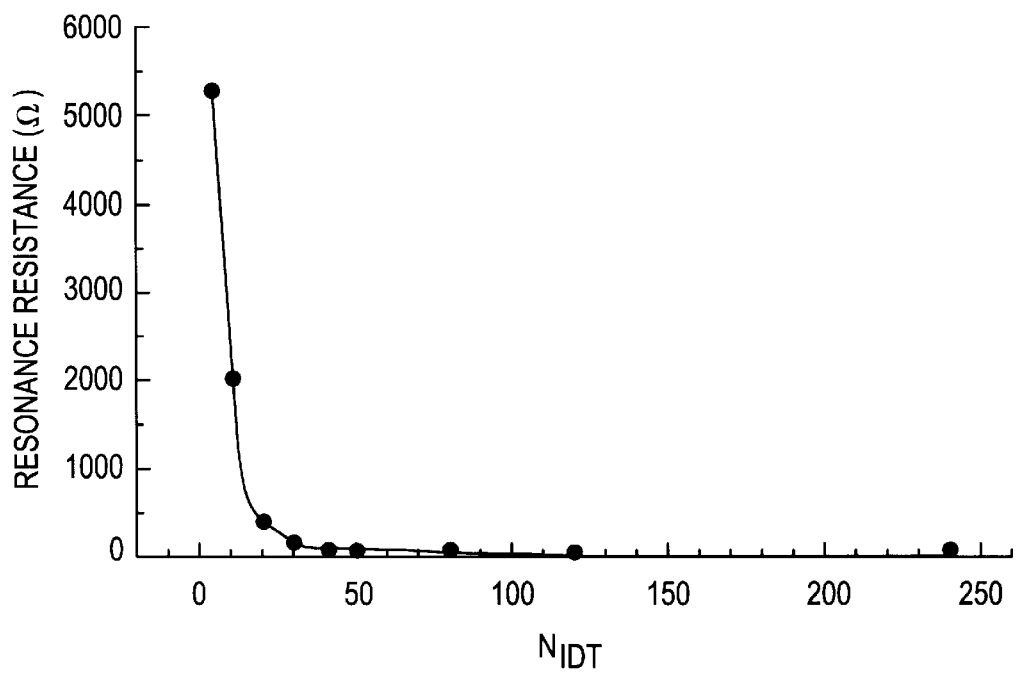
FIG. 13 is a graph showing the relationship between the number $N_{IDT}$ of electrode pairs of IDT and the resonant resistance of the surface acoustic wave resonator of a preferred embodiment of the present invention.

As seen in FIG. 13, the resonance resistance is reduced as the number $N_{IDT}$ increases. When the number $N_{IDT}$ exceeds 100, the resonant resistance becomes substantially constant. Accordingly, it is seen in FIG. 13 that when $N_{IDT}$ is set to have a value up to 100, the resonant resistance can be easily controlled by adjusting the number $N_{IDT}$.

As seen in FIGS. 12 and 13, for the surface acoustic wave resonator 1 having the transducer IDT made of Ta disposed on the quartz substrate with the above-described Euler angles according to preferred embodiments of the present invention, the resonant resistance and the band width ratio can be easily controlled by adjusting the number $N_{IDT}$. More particularly, the resonant resistance can be easily controlled by adjusting the number $N_{IDT}$ if it is in the range of up to 100, while the desired bandwidth ratio can be easily achieved by adjusting the number $N_{IDT}$ if it is in the range of up to 20.

Figure 14:
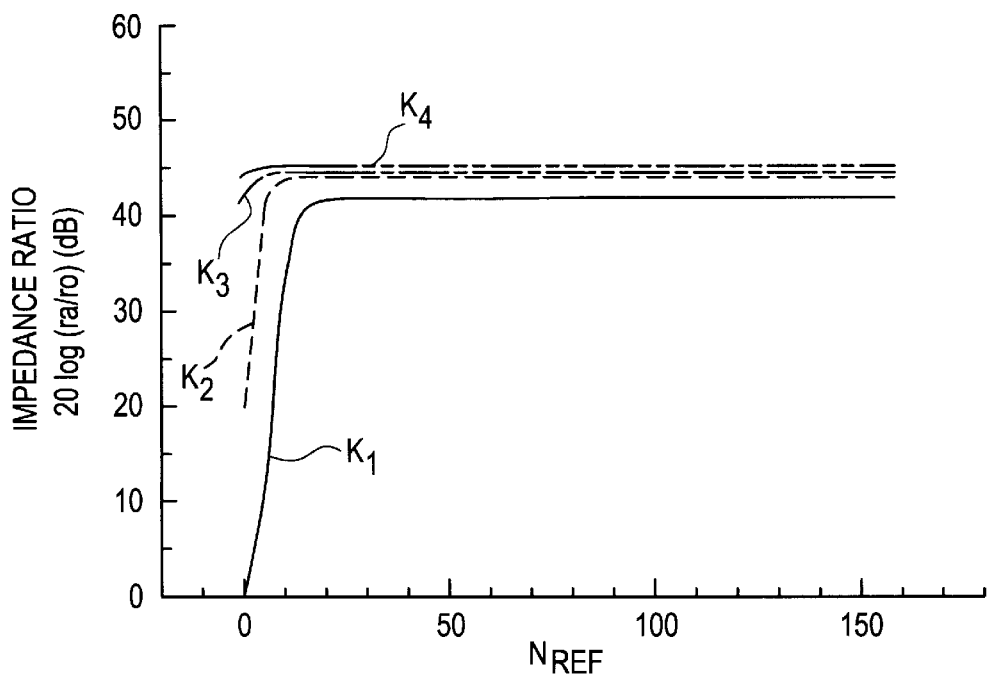
FIG. 14 is a graph showing the relationship between the number $N_{REF}$ of electrode pairs and the impedance ratio of the surface acoustic wave resonator of a preferred embodiment of the present invention.

Moreover, the inventors of the present invention produced the above surface acoustic wave resonator 1 in which the IDT 3 was provided on the quartz substrate with the approximate Euler angles (0, 127°, 90°) in such a manner so as to have a film thickness of the IDT 3 at h/λ=0.02 and d=0.6, and made an examination of how the impedance ratio is changed when the number of electrode fingers of the respective reflectors is varied. FIG. 14 shows the results. The number $N_{REF}$ of electrode fingers of the reflector is plotted on the abscissa in FIG. 14 and the impedance ratio is plotted on the ordinate.

Moreover, in FIG. 14, a solid line $K_1$, a broken line $K_2$, an alternate long and short dash line $K_3$, and an alternate long and two short dashes line $K_4$ represents the results at the numbers $N_{IDT}$=5, 20, 80, and 160, respectively.

As seen in FIG. 14, with the number $N_{REF}$ of electrode fingers of the reflector increased, the impedance ratio tends to increase, irrespective of the number $N_{REF}$. In addition, when the number $N_{REF}$ exceeds 20, the rising of the impedance ratio becomes saturated.

Accordingly, when the number $N_{REF}$ is less than or equal to 20, the impedance ratio can be easily controlled by adjusting the number of $N_{REF}$.

Thus, for the surface acoustic wave resonator 1 having the transducer IDT made of Ta disposed on the quartz substrate with the above-described Euler angles, the impedance ratio can be easily controlled by adjusting the number $N_{REF}$ if it is less than or equal to 20. In this manner, desired excellent characteristics can be certainly obtained.

Figure 24:
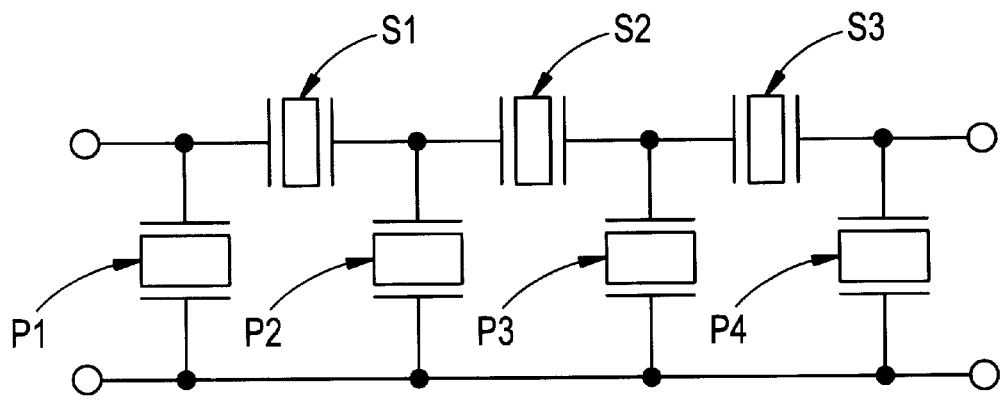
FIG. 24 is a circuit diagram of a surface acoustic wave filter incorporating a plurality of surface acoustic wave resonators according to a preferred embodiment, in accordance with another preferred embodiment of the present invention.

In the surface acoustic wave device of preferred embodiments of the present invention, the surface acoustic wave filter may be constructed by using a plurality of the above-described surface acoustic wave resonators 1. The configuration of the surface acoustic wave filter is not particularly restricted. For example, as shown in the circuit diagram of FIG. 24, a plurality of surface acoustic wave resonators 1 may be arranged in series arms and parallel arms, as series arm resonators S1 through S3 and parallel arm resonators P1 through P4, to define a ladder type filter. That is, the present invention may be applied to a surface acoustic wave filter made up of plural surface acoustic wave resonators.

Figure 22:
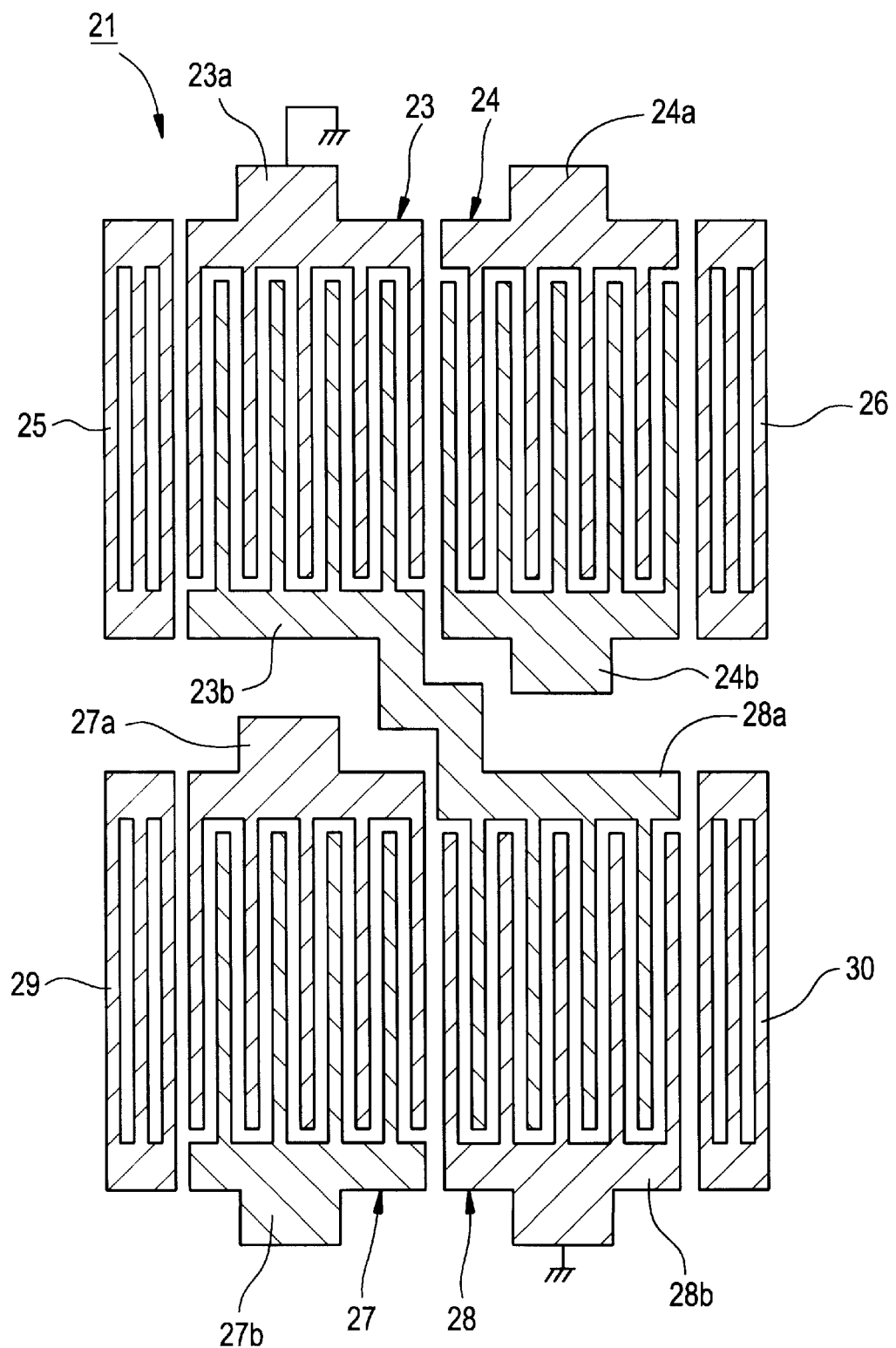
FIG. 22 is an explanatory plan view of a modified example of the longitudinally coupled surface acoustic wave filter of the present invention.

In addition, a longitudinally coupled surface acoustic wave filter may be constructed by arranging two interdigital transducer IDTs between the reflectors, as described below with reference with FIGS. 15 and 22.

Figure 15:
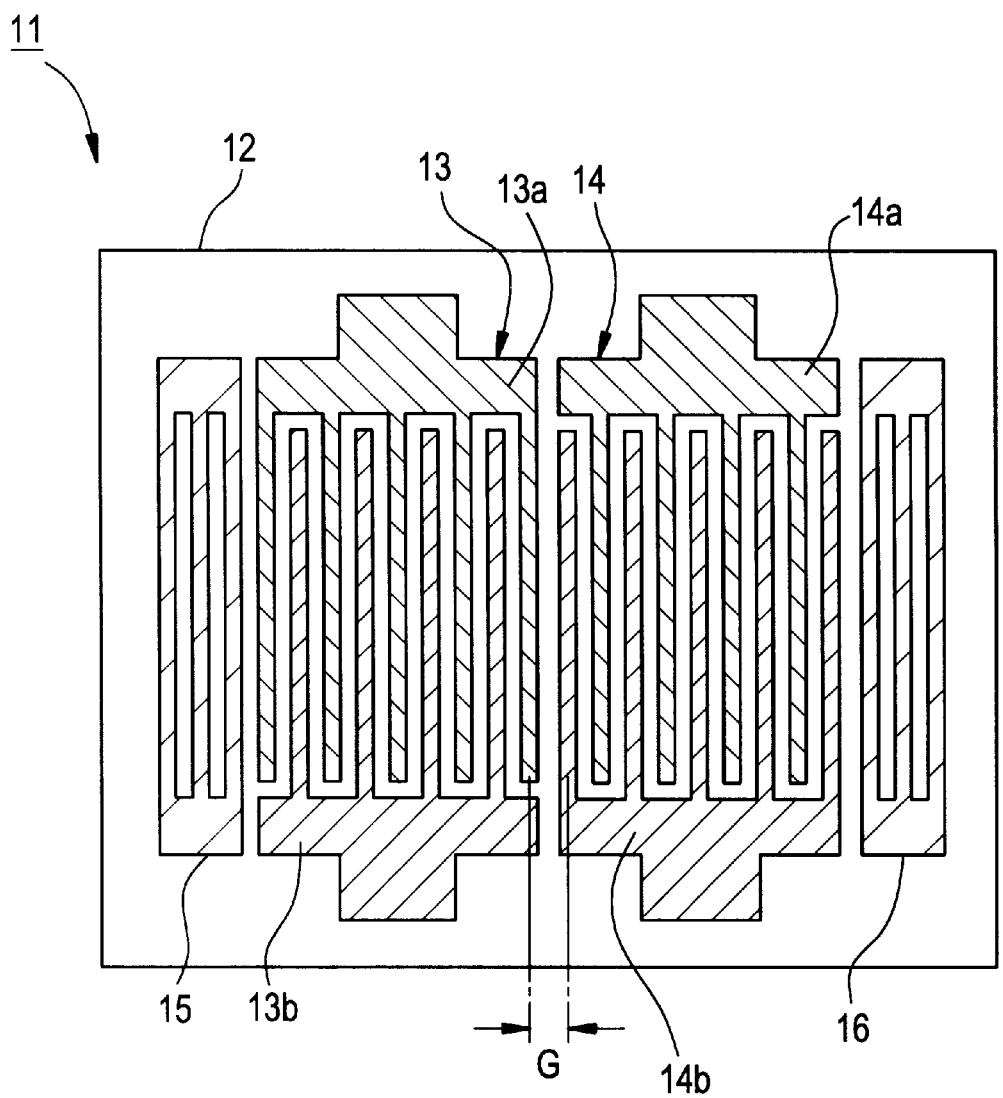
FIG. 15 is a plan view of a longitudinally coupled surface acoustic wave filter according to another preferred embodiment of the present invention.

FIG. 15 is a schematic plan view of a surface acoustic wave filter according to a another preferred embodiment of the present invention. The surface acoustic wave filter 11 is preferably formed by using a quartz substrate 12. In the quartz substrate 12, the angle θ of Euler angles (0, θ, 90°) preferably satisfies the following formula: 125°≦θ°≦128°, as with the surface acoustic wave resonator of the first preferred embodiment.

On the quartz substrate 12, first, second interdigital transducer IDTs 13, 14 are provided. The transducer IDTs 13, 14 have a pair of interdigital electrodes 13a, 13b, and a pair of interdigital electrodes 14a, 14b, respectively. The electrode fingers of a pair of the interdigital electrodes 13a, 13b are inserted into the spaces between them. Similarly, the electrode fingers of a pair of the interdigital electrodes 14a, 14b are inserted into the spaces between them.

The transducer IDTs 13, 14 are arranged so as to be separated from each other by a gap G along the surface acoustic wave propagation direction.

Grating type reflectors 15, 16 to which the plural electrode fingers are short-circuited at the ends thereof are arranged on the opposite sides of the region where the transducers IDT 13, 14 are provided, in the surface acoustic wave propagation direction.

The above transducers IDT 13, 14 and the reflectors 15, 16 are preferably made of tungsten or tantalum.

The surface acoustic wave of this preferred embodiment is characteristic in that, in addition to the above-described particular quartz substrate and the transducers IDT 13, 14 made of an electrode material containing one of Ta and W, the respective numbers $N_{IDT}$ of electrode finger pairs of the first, second transducers IDT 13, 14 are set to be up to $N_{IDT}^{MAX}$ (x) which is a value defined as follows.

$$N_{IDT}^{MAX}(x)=338\{x-(0.22+0.55n)\}^2+25 \quad \text{formula (5)}$$

where x=G/λ (G represents the size of the gap G between the electrode fingers of IDT 13, 14 in the center thereof), and n is an integer defined in accordance with:

$$-0.055+0.55n \leq x \leq 0.495+0.55n.$$

In the longitudinally coupled surface acoustic wave filter 11 of this preferred embodiment, the number $N_{IDT}$ is set to be up to the above-described $N_{IDT}^{MAX}$. Accordingly, the mode interval (ratio (%) of the difference in frequency between the longitudinal fundamental mode and the longitudinal higher-order mode to the center frequency) can be controlled as described below, and thereby, the bandwidth can be adjusted. This will be described with reference to FIGS. 16 through 21.

Figure 16A:
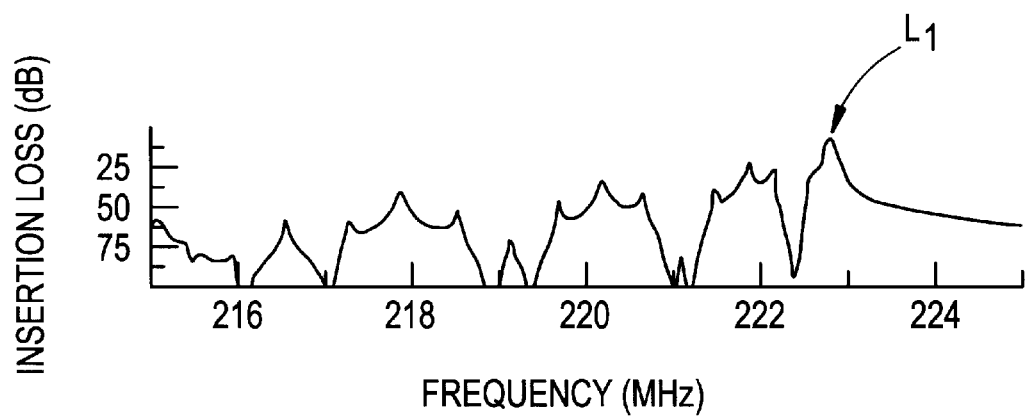
FIGS. 16A and 16B are graphs of the insertion loss vs. frequency characteristics of the longitudinally coupled surface acoustic wave filter, obtained when $N_{IDT}$ is varied.
Figure 16B:
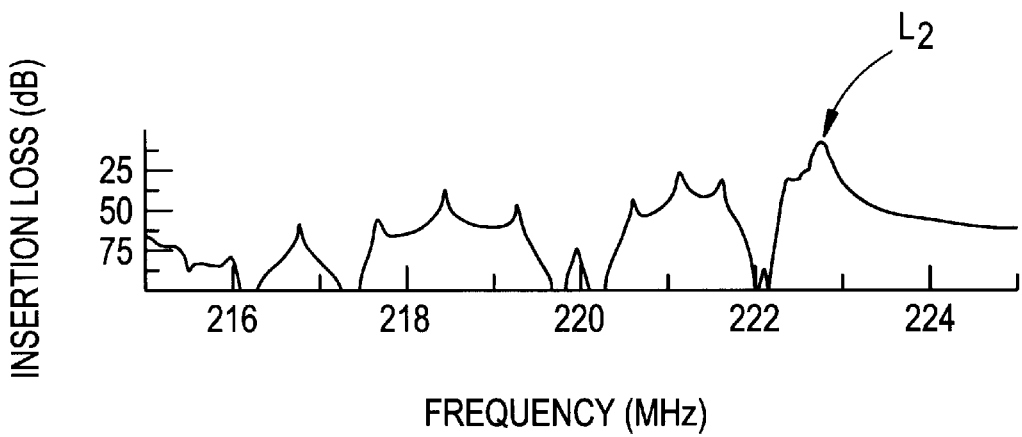
Figure 17:
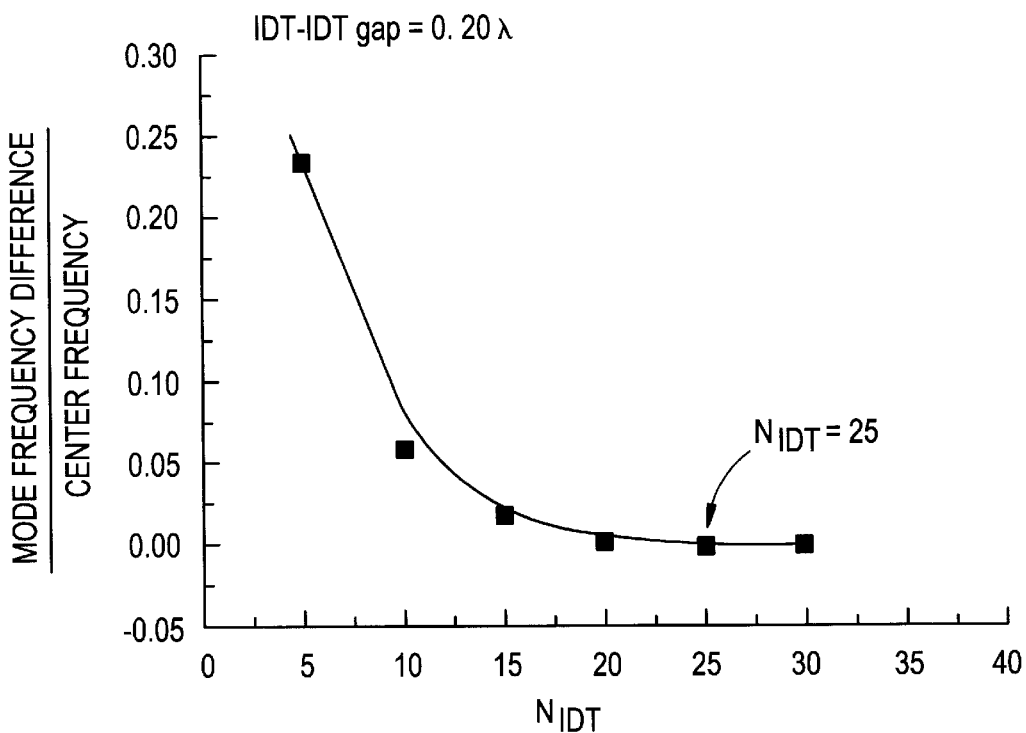
FIG. 17 is a graph showing the relationship between $N_{IDT}$ and the bandwidth of the longitudinally coupled surface acoustic wave filter of a preferred embodiment of the present invention, obtained when the gap between IDTs is x=0.20 λ.
Figure 18:
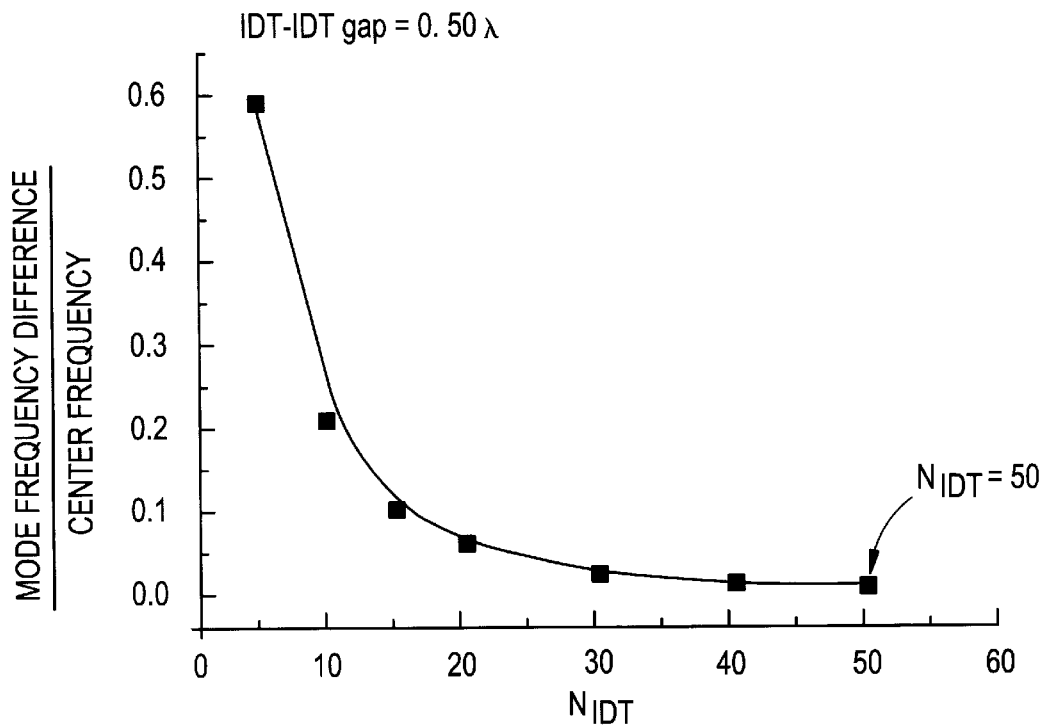
FIG. 18 is a graph showing the relationship between $N_{IDT}$ and the bandwidth of the longitudinally coupled surface acoustic wave filter of a preferred embodiment of the present invention, obtained when the gap between IDTs is x=0.50 λ.
Figure 19:
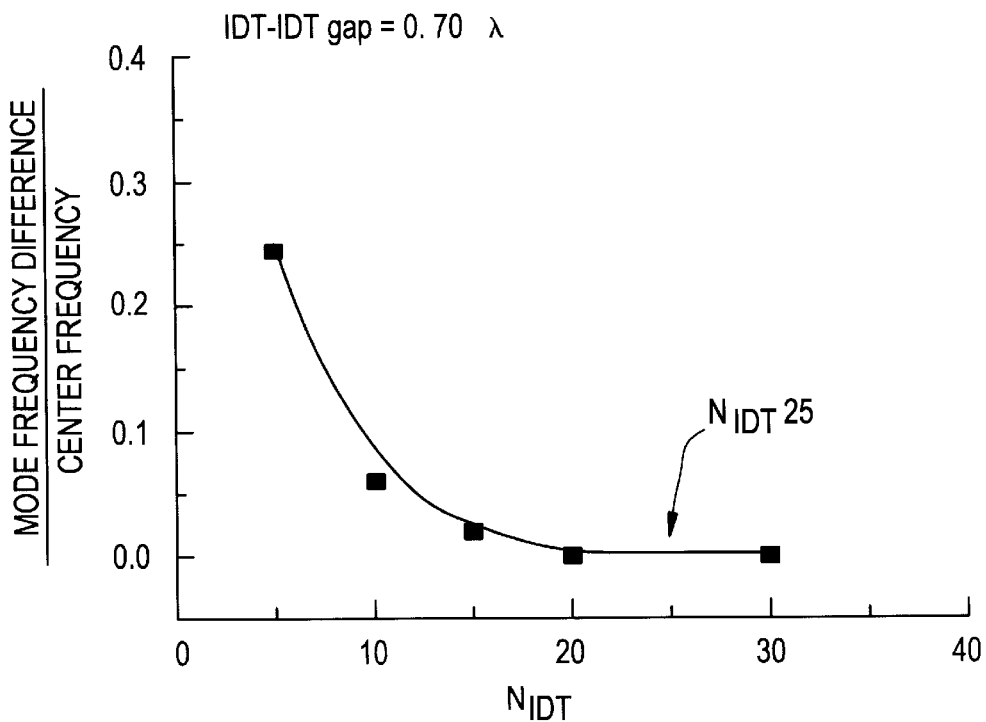
FIG. 19 is a graph showing the relationship between $N_{IDT}$ and the bandwidth of the longitudinally coupled surface acoustic wave filter of a preferred embodiment of the present invention, obtained when the gap between IDTs is x=0.70 λ.
Figure 20:
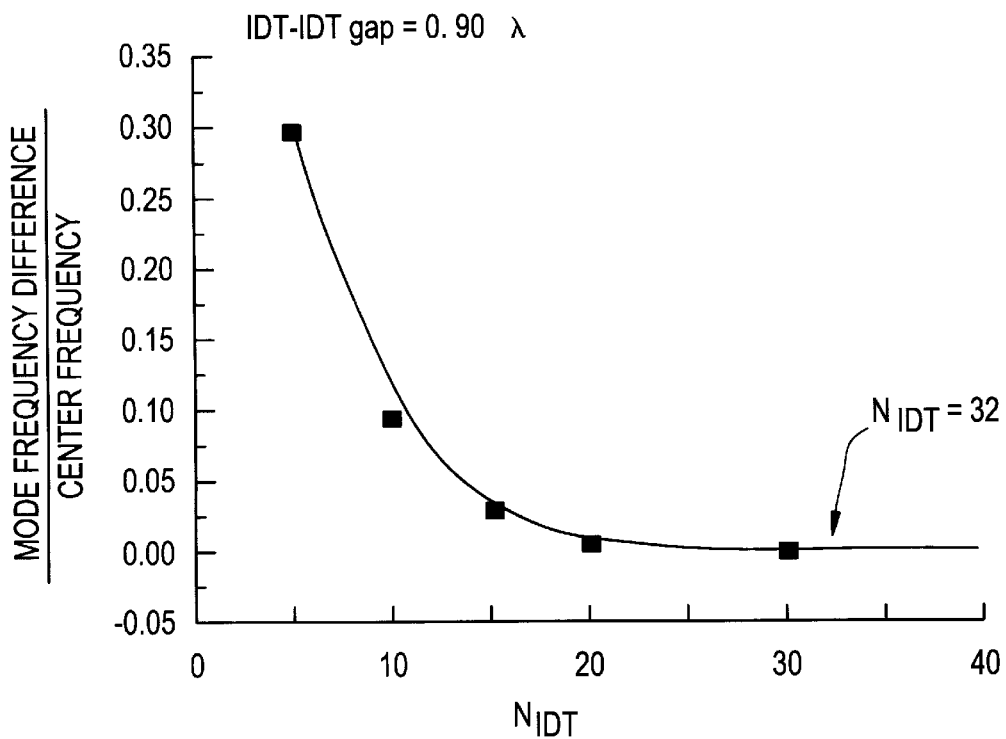
FIG. 20 is a graph showing the relationship between $N_{IDT}$ and the bandwidth of the longitudinally coupled surface acoustic wave filter of a preferred embodiment of the present invention, obtained when the gap between IDTs is x=0.90 λ.

FIGS. 16A and 16B show the insertion loss-frequency characteristics of the surface acoustic wave filter 11 in which the gap between the first IDT 13 and the second IDT 14 is about 0.50 λ, the numbers $N_{IDT}$ are 50 (for FIG. 16A) and 30 (for FIG. 16B), the number $N_{REF}$ is 40, and the respective gaps between the reflectors 15, 16 and the transducers IDT 13, 14 adjacent thereto along the surface acoustic wave propagation direction are about 0.50 λ, and the load impedance is about 50Ω. The characteristics in FIGS. 16A and 16B and FIGS. 17 through 20 described below were obtained under the condition that the quartz substrate having the Euler angles (0, 127°, 90°) is used, the film thickness h/λ of the transducers IDT 13, 14 is about 0.02, and d is about 0.6.

In the characteristics of FIGS. 16A and 16B, the frequency bands to be used are indicated by arrows $L_1$ and $L_2$. As understood when the bands indicated by the arrows $L_1$ and $L_2$ are compared, the bandwidths become different by varying the values of $N_{IDT}$.

The difference between the above bandwidths is a phenomenon caused by the overlap of the fundamental mode and the higher order mode. Accordingly, the inventors of the present invention made an investigation concerning how the ratio, namely, the bandwidth, of the frequency difference (mode frequency difference) between the higher order mode and the fundamental mode to the center frequency is changed with the number $N_{IDT}$. The results are shown in FIGS. 17 through 20.

In view of the fact that the above-described change in the bandwidth is caused by not only the number $N_{IDT}$ but also the gap between the first, second transducers IDT 13, 14, the gap G was also varied. That is, FIGS. 17, 18, 19 and 20 show the characteristics measured when a gap x between IDTs 13, 14 has a value of 0.20 λ, 0.50 λ, 0.70 λ, and 0.90 λ, respectively.

As seen in FIGS. 17 through 20, when the number $N_{IDT}$ is reduced, the bandwidth is increased. When the number $N_{IDT}$ is increased, the bandwidth is reduced. When the number $N_{IDT}$ exceeds a constant value, the bandwidth becomes zero.

Accordingly, in the longitudinally coupled surface acoustic wave filter 11, the filter characteristics having a bandwidth can be obtained by setting $N_{IDT}$ to have a value up to the constant value. Further, a desired bandwidth can be realized by adjusting the number $N_{IDT}$ in the range of the above-described constant value and lower.

On the other hand, the number $N_{IDT}$ at which the bandwidth becomes zero is varied with the value of x. Accordingly, similar characteristics were obtained by varying the gap G between the IDTs, as in the case of the characteristics of FIGS. 18 through 20. The results are shown in FIG. 21.

Figure 21:
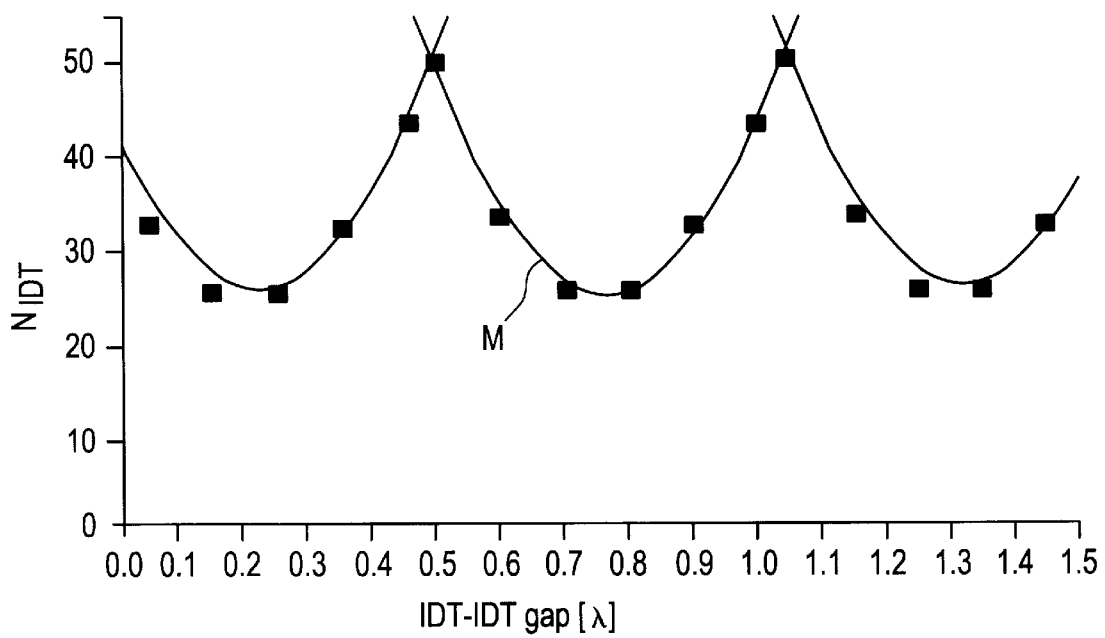
FIG. 21 is a graph showing the relationship between the gap x between the transducers IDT and $N_{IDT}^{MAX}$ of the longitudinally coupled surface acoustic wave filter of a preferred embodiment of the present invention.

In FIG. 21, the gap x between the transducers IDT is plotted on the abscissa, and the number $N_{IDT}$ on the ordinate. That is, in the case of the characteristics shown in FIG. 18, when the gap x between the IDTs is about 0.50 λ, the bandwidth is zero at $N_{IDT}$=50. Thus, in FIG. 21, the number $N_{IDT}$ is 50 at X=0.5.

Accordingly, by setting the number $N_{IDT}$ to be in the range which is on the lower side of a curve M, prepared by connecting the measurements, in FIG. 21, a bandwidth can be obtained, and further a desired bandwidth can be realized by adjusting the number $N_{IDT}$ in the above-described range.

By approximation of the curve M of FIG. 21, the value $N_{IDT}^{MAX}$ (X) which is the number $N_{IDT}$ positioning on the curve M can be expressed by the formula (5):

$$N_{IDT}^{MAX}(x)=338\{x-(0.22+0.55n)\}^2+25 \quad \text{formula (5)}$$

where n satisfies $0.22+0.55n-(0.55/2) \leq x \leq 0.22+0.55n+(0.55/2)$, that is:

$$-0.055+0.55n \leq x \leq 0.495+0.55n \quad \text{formula (6)}.$$

Thus, n is an integer satisfying the above formula (6). As understood from the curve M of FIG. 21, there exists periodicity between x and the value $N_{IDT}^{MAX}$. That is, the value $N_{IDT}^{MAX}$ (x) depends on n, as indicated by the formula (5).

Accordingly, in the longitudinally coupled surface acoustic wave filter 11 of this preferred embodiment, a bandwidth can be obtained by setting the number $N_{IDT}$, which is the number of electrode pairs of the transducers IDT 13, 14, to be up to the value $N_{IDT}^{MAX}$ (x) defined as described above, and a desired bandwidth can be easily realized by adjusting the number $N_{IDT}$ in the above-described range.

Figure 23:
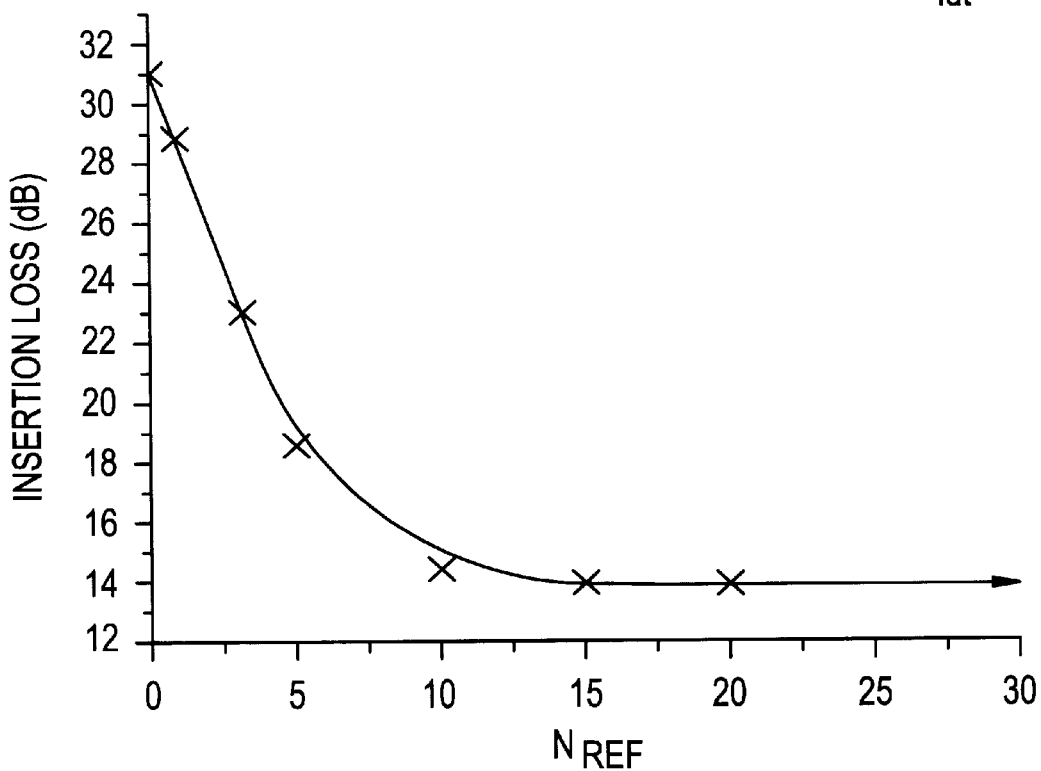
FIG. 23 is a graph showing the relationship between the number $N_{REF}$ of electrode fingers and the insertion loss of the longitudinally coupled surface acoustic wave filter of a preferred embodiment of the present invention.

Moreover, the inventors of the present invention made an examination of how the insertion loss is changed when the number $N_{REF}$ of electrode fingers of the reflector is varied in the above longitudinally coupled surface acoustic wave filter 11. More particularly, in a manner similar to that described above, different types of the surface acoustic wave filters 11 are produced by forming the transducers IDT 13, 14 of a Ta thin film, having h/λ=0.02 and d=0.6, on the quartz substrate with the Euler angles (0, 127°, 90°) and the reflectors 15, 16 having the different numbers of electrode fingers. The insertion loss of these surface acoustic wave filters 11 was measured. FIG. 23 shows the results.

The above-described insertion loss is affected by the numbers of electrode finger pairs of the transducers IDT 13, 14 and the size of the gap G between IDT 13, 14. Accordingly, different types of the surface acoustic wave filters 11 having the different numbers of electrode finger pairs of IDT 13, 14 and different gaps G between IDTs 13, 14 were produced. The insertion loss was measured. FIG. 23 illustrates the results.

As seen in FIG. 23, with the number $N_{REF}$ of electrode fingers of the respective reflectors 15, 16 increased, the insertion loss is reduced, irrespective of the number $N_{IDT}$ of electrode finger pairs of IDT and the size of the gap G between IDTs 13, 14. When the number $N_{REF}$ of electrode fingers of the respective reflectors exceeds 20, the insertion loss becomes substantially constant.

Accordingly, the insertion loss can be controlled by adjusting the number $N_{REF}$ if it has a value of up to 20. That is, the surface acoustic wave filter 11 having a desired insertion loss can be easily provided by adjusting the number $N_{REF}$.

The surface acoustic wave filter 11 of FIG. 15 is a longitudinally coupled surface acoustic wave filter containing the first IDT 13 and the second IDT 14. The longitudinally coupled surface acoustic wave filter of preferred embodiments of the present invention may have a configuration with a pole number of at least two. FIG. 22 is a plan view showing the electrode configuration of a longitudinally coupled surface acoustic wave filter which is formed by longitudinally connecting two of the longitudinally coupled surface acoustic wave filters 11 as shown in FIG. 15.

In a surface acoustic wave filter 21, a first interdigital transducer 23 and a second interdigital transducer 24 are made of Ta or W and disposed on the quartz substrate with the desired Euler angles. Reflectors 25, 26 are disposed on the opposite sides of the region where IDTs 23, 24 are provided, in the surface acoustic wave propagation direction. Further, a first interdigital transducer 27 and a second interdigital transducer 28 are provided on one side of the region where IDTs 23, 24 are provided. Reflectors 29, 30 are disposed on the opposite sides of the region where IDTs 27, 28 are provided, in the surface acoustic wave propagation direction. The transducers IDT 23, 24, 27, and 28 have paired interdigital electrodes 23a and 23b, 24a and 24b, 27a and 27b, and 28a and 28b, respectively.

In this case, the surface acoustic wave filter having a configuration with the pole number of two is formed in which a surface acoustic wave filter section made up of IDTs 23, 24 and the reflectors 25, 26, and a surface acoustic wave filter section made up of IDTs 27, 28 and the reflectors 29, 30 are connected to each other.

More particularly, one interdigital electrode 23a of the IDT 23 is connected to ground, while the other interdigital electrode 23b is electrically connected to one interdigital electrode 28a of IDT 28. The other interdigital electrode 28b of IDT 28 is electrically connected to ground. Accordingly, the above-described two surface acoustic wave filter sections are longitudinally connected so as to have a configuration with the pole number of two.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A longitudinally coupled surface acoustic wave filter comprising:

a quartz substrate having an angle $\theta$ of Euler angles (0, $\theta$, 90°) which has a value that is greater than or equal to about 122° and is less than or equal to about 131°;

first and second interdigital transducers arranged on said quartz substrate so as to be separated by a gap and made of an electrode material including at least one of Ta and W; and reflectors arranged on the opposite sides of a region where the first and second interdigital transducers are located along a surface wave propagation direction;

the respective reflectors having a number $N_{REF}$ of electrode fingers of up to 20.

2. A longitudinally coupled surface acoustic wave filter according to claim 1, wherein at least one of said first and second interdigital transducers has an electrode finger cross width of up to about 40 $\lambda$ where $\lambda$ represents a wavelength of a surface acoustic wave generated in the surface acoustic wave filter.

3. A longitudinally coupled surface acoustic wave filter according to claim 1, wherein the electrode material constituting at least one of said first and second interdigital transducers is Ta, and the angle $\theta$ satisfies formula (1):

$$\theta = 125.44 + 108.27 \times d \times h/\lambda \pm 1.2 \qquad \text{formula (1)}$$

where h represents a film thickness of said at least one of said first and second interdigital transducers, d represents an electrode finger metallization ratio of said at least one of said first and second interdigital transducers, and $\lambda$ represents a wavelength of a surface acoustic wave generated in the surface acoustic wave filter.

4. A longitudinally coupled surface acoustic wave filter according to claim 1, wherein the electrode material constituting at least one of said first and second interdigital transducers is W, and the angle $\theta$ satisfies formula (2):

$$\theta = 125.70 + 49.87 \times d \times h/\lambda \pm 1.2 \qquad \text{formula (2)}$$

where h represents a film thickness of said at least one of said first and second interdigital transducers, d represents an electrode finger metallization ratio of said at least one of said first and second interdigital transducers, and $\lambda$ represents a wavelength of a surface acoustic wave generated in the surface acoustic wave filter.

5. A surface acoustic wave device comprising:

a quartz substrate having an angle $\theta$ of Euler angles (0, $\theta$, 90°) which has a value that is greater than or equal to about 122° and is less than or equal to about 131°; and an interdigital transducer made of an electrode material including at least one of Ta and W and disposed on said quartz substrate;

wherein the electrode material constituting said interdigital transducer is W, and the angle $\theta$ satisfies formula (2):

$$\theta = 125.70 + 49.87 \times d \times h/\lambda \pm 1.2 \qquad \text{formula (2)}$$

where h represents a film thickness of said interdigital transducer, d represents an electrode finger metallization ratio of said interdigital transducer, and $\lambda$ represents a wavelength of a surface acoustic wave generated in the surface acoustic wave device.

6. A surface acoustic wave device comprising:

a quartz substrate having an angle $\theta$ of Euler angles (0, $\theta$, 90°) which has a value that is greater than or equal to about 122° and is less than or equal to about 131°; and an interdigital transducer made of an electrode material including at least one of Ta and W and disposed on said quartz substrate;

wherein the surface acoustic wave device further includes reflectors arranged on opposite sides of said interdigital transducer along a surface acoustic wave propagation direction, so as to define a surface acoustic wave resonator, and the number $N_{IDT}$ of electrode finger pairs of said interdigital transducer has a value of up to 200.

7. A surface acoustic wave device according to claim 6, wherein the number $N_{IDT}$ has a value of up to 100.

8. A surface acoustic wave device according to claim 6, wherein the number $N_{IDT}$ has a value of up to 20.

9. A surface acoustic wave device comprising:

a quartz substrate having an angle $\theta$ of Euler angles (0, $\theta$, 90°) which has a value that is greater than or equal to about 122° and is less than or equal to about 131°; and an interdigital transducer made of an electrode material including at least one of Ta and W and disposed on said quartz substrate;

wherein reflectors are disposed on opposite sides of said interdigital transducer along a surface acoustic wave propagation direction and the reflectors include plural electrode fingers extending in a direction that is substantially perpendicular to a surface acoustic wave propagation direction and the electrode fingers are short-circuited at opposite ends thereof, so as to define a surface acoustic wave resonator, and the number $N_{REF}$ of electrode fingers of the respective reflectors has a value of up to 20.

10. A surface acoustic wave filter comprising:

a quartz substrate having an angle $\theta$ of Euler angles (0, $\theta$, 90°) which has a value that is greater than or equal to about 122° and is less than or equal to about 131°;

an interdigital transducer made of an electrode material including at least one of Ta and W and disposed on said quartz substrate; and reflectors arranged on opposite sides of said interdigital transducer along a surface acoustic wave propagation direction; wherein the number $N_{IDT}$ of electrode finger pairs of said interdigital transducer has a value of up to 200.

11. A surface acoustic wave filter according to claim 10, wherein the number $N_{IDT}$ has a value of up to 100.

12. A surface acoustic wave filter according to claim 10, wherein the number $N_{IDT}$ has a value of up to 20.

13. A surface acoustic wave filter according to claim 10, wherein the reflectors include plural electrode fingers extending in a direction that is substantially perpendicular to the surface acoustic wave propagation direction and the electrode fingers are short-circuited at opposite ends thereof, and the number $N_{REF}$ of electrode fingers of the respective reflectors has a value of up to 20.

14. A longitudinally coupled surface acoustic wave filter comprising:

a quartz substrate having an angle $\theta$ of Euler angles (0, $\theta$, 90°) which has a value that is greater than or equal to about 122° and is less than or equal to about 131°;

first and second interdigital transducers arranged on said quartz substrate so as to be separated by a gap and made of an electrode material including at least one of Ta and W; and reflectors arranged on opposite sides of a region where the first and second interdigital transducers are provided on the quartz substrate, along a surface wave propagation direction; wherein the first and second interdigital transducers have a number $N_{IDT}$ of electrode fingers up to $N_{IDT}^{MAX}(x)$ defined in accordance with $N_{IDT}^{MAX}(x)=338\{x-(0.22+0.55n)\}^2+25$ where $x=G/\lambda$, G represents a size of the gap G between the first and second interdigital transducers along the surface acoustic wave propagation direction, and n is an integer defined in accordance with $-0.055+0.55n \leq x \leq 0.495+0.55n$, and $\lambda$ represents a wavelength of a surface acoustic wave generated in the surface acoustic wave filter.

15. A longitudinally coupled surface acoustic wave filter according to claim 14, wherein at least one of said first and second interdigital transducers has an electrode finger cross width of up to about 40 $\lambda$ where $\lambda$ represents a wavelength of a surface acoustic wave generated in the surface acoustic wave filter.

16. A longitudinally coupled surface acoustic wave filter according to claim 14, wherein the electrode material constituting at least one of said first and second interdigital transducers is Ta, and the angle $\theta$ satisfies formula (1):

$$\theta=125.44+108.27\times d\times h/\lambda \pm 1.2 \qquad \text{formula (1)}$$

where h represents a film thickness of said at least one of said first and second interdigital transducers, d represents an electrode finger metallization ratio of said at least one of said first and second interdigital transducers, and $\lambda$ represents a wavelength of a surface acoustic wave generated in the surface acoustic wave filter.

17. A longitudinally coupled surface acoustic wave filter according to claim 14, wherein the electrode material constituting at least one of said first and second interdigital transducers is W, and the angle $\theta$ satisfies formula (2):

$$\theta=125.70+49.87\times d\times h/\lambda \pm 1.2 \qquad \text{formula (2)}$$

where h represents a film thickness of said at least one of said first and second interdigital transducers, d represents an electrode finger metallization ratio of said at least one of said first and second interdigital transducers, and $\lambda$ represents a wavelength of a surface acoustic wave generated in the surface acoustic wave filter.

18. A surface acoustic wave device comprising:

a quartz substrate having an angle $\theta$ of Euler angles (0, $\theta$, 90°) which has a value that is greater than or equal to about 122° and is less than or equal to about 131°; and an interdigital transducer made of an electrode material including at least one of Ta and W and disposed on said quartz substrate; wherein said interdigital transducer has an electrode finger cross width of up to about 40 $\lambda$ where $\lambda$ represents a wavelength of a surface acoustic wave generated in the surface acoustic wave device.

19. A surface acoustic wave device according to claim 18, wherein the angle $\theta$ of Euler angles (0, $\theta$, 90°) has a value that is greater than or equal to about 125° and is less than or equal to about 128°.

20. A surface acoustic wave device comprising:

a quartz substrate having an angle $\theta$ of Euler angles (0, $\theta$, 90°) which has a value that is greater than or equal to about 122° and is less than or equal to about 131°; and an interdigital transducer made of an electrode material including at least one of Ta and W and disposed on said quartz substrate;

wherein the electrode material constituting said interdigital transducer is Ta, and the angle $\theta$ satisfies formula (1):

$$\theta=125.44+108.27\times d\times h/\lambda \pm 1.2 \qquad \text{formula (1)}$$

where h represents a film thickness of said interdigital transducer, d represents an electrode finger metallization ratio of said interdigital transducer, and $\lambda$ represents a wavelength of a surface acoustic wave generated in the surface acoustic wave device.

* * * * *